(12) United States Patent
Peng et al.

(10) Patent No.: US 12,002,416 B2
(45) Date of Patent: Jun. 4, 2024

(54) DISPLAY PANEL AND DISPLAY DEVICE

(71) Applicant: WUHAN TIANMA MICRO-ELECTRONICS CO., LTD., Wuhan (CN)

(72) Inventors: Chao Peng, Wuhan (CN); Huifang Zhou, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 18/188,807

(22) Filed: Mar. 23, 2023

(65) Prior Publication Data
US 2023/0222969 A1    Jul. 13, 2023

(30) Foreign Application Priority Data
Nov. 8, 2022    (CN) .......................... 202211393853.7

(51) Int. Cl.
*G09G 3/32* (2016.01)
*G11C 19/28* (2006.01)

(52) U.S. Cl.
CPC .............. *G09G 3/32* (2013.01); *G11C 19/28* (2013.01); *G09G 2310/0267* (2013.01); *G09G 2310/0275* (2013.01); *G09G 2310/0286* (2013.01); *G09G 2320/0233* (2013.01)

(58) Field of Classification Search
None
See application file for complete search history.

(56) References Cited

U.S. PATENT DOCUMENTS

2021/0375197 A1* 12/2021 Dai ................... G02F 1/136204

FOREIGN PATENT DOCUMENTS

CN          109410823 A       3/2019

\* cited by examiner

*Primary Examiner* — Stephen T. Reed
(74) *Attorney, Agent, or Firm* — CHRISTENSEN O'CONNOR JOHNSON KINDNESS PLLC

(57) ABSTRACT

Provided are a display panel and a display device. The display panel has a display region and includes a substrate, light-emitting elements located in the display region, pixel circuits, and at least one driving circuit. The light-emitting elements, the pixel circuits and the at least one driving circuit are located at a side of the substrate. The light-emitting elements are connected to the pixel circuits, and each driving circuit includes shift registers. The pixel circuits includes at least one first pixel circuit including a first driving circuit, and the at least one first pixel circuit and at least one shift register are located in the display region. In the display region, the at least one first pixel circuit is arranged at a side of the shift registers of the first driving circuit close to an edge of the display panel.

20 Claims, 14 Drawing Sheets

DISPLAY PANEL AND DISPLAY DEVICE

CROSS-REFERENCE TO RELATED APPLICATIONS

The present application claims priority to Chinese Patent Application No. 202211393853.7, filed on Nov. 8, 2022, the content of which is incorporated herein by reference in its entirety.

TECHNICAL FIELD

The present disclosure relates to the field of display technology, and in particular, to a display panel and a display device.

BACKGROUND

With the development of full-screen technology, the current display product market has higher and higher requirements for narrow frames. In fact, structures such as driving circuits need to be provided in a frame region of the display panel, and currently it is impossible to compress a space occupied by the driving circuit, thus limiting the narrowing of the frame of the display panel.

SUMMARY

In a first aspect, an embodiment of the present disclosure provides a display panel. The display panel has a display region and includes a substrate, light-emitting elements located in the display region, pixel circuits, and at least one driving circuit. The light-emitting elements, the pixel circuits, and the at least one driving circuit are located at a side of the substrate. The light-emitting elements are connected to the pixel circuits, and each of the at least one driving circuit includes shift registers. The pixel circuits include at least one first pixel circuit, the at least one driving circuit includes a first driving circuit, and the at least one first pixel circuit and at least one shift register of the shift registers of the first driving circuit are located in the display region. In the display region, the at least one first pixel circuit is arranged at sides of the shift registers of the first driving circuit that are close to an edge of the display panel.

In a second aspect, an embodiment of the present disclosure provides a display device including a display panel. The display panel has a display region and includes a substrate, light-emitting elements located in the display region, pixel circuits, and at least one driving circuit. The light-emitting elements, the pixel circuits, and the at least one driving circuit are located at a side of the substrate. The light-emitting elements are connected to the pixel circuits, and each of the at least one driving circuit includes shift registers. The pixel circuits include at least one first pixel circuit, the at least one driving circuit includes a first driving circuit, and the at least one first pixel circuit and at least one shift register of the shift registers of the first driving circuit are located in the display region. In the display region, the at least one first pixel circuit is arranged at sides of the shift registers of the first driving circuit that are close to an edge of the display panel.

BRIEF DESCRIPTION OF DRAWINGS

In order to more clearly illustrate technical solutions in embodiments of the present disclosure or in the related art, the accompanying drawings used in the embodiments and in the related art are briefly introduced as follows. It should be noted that the drawings described as follows are merely part of the embodiments of the present disclosure, other drawings can also be acquired by those skilled in the art.

DESCRIPTION OF EMBODIMENTS

In order to make the purpose, technical solutions, and advantages of the embodiments of the present disclosure be understandable, the technical solutions in the embodiments of the present disclosure are described in the following with reference to the accompanying drawings. It should be understood that the described embodiments are merely exemplary embodiments of the present disclosure, which shall not be interpreted as providing limitations to the present disclosure. All other embodiments obtained by those skilled in the art according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

Figure 1:
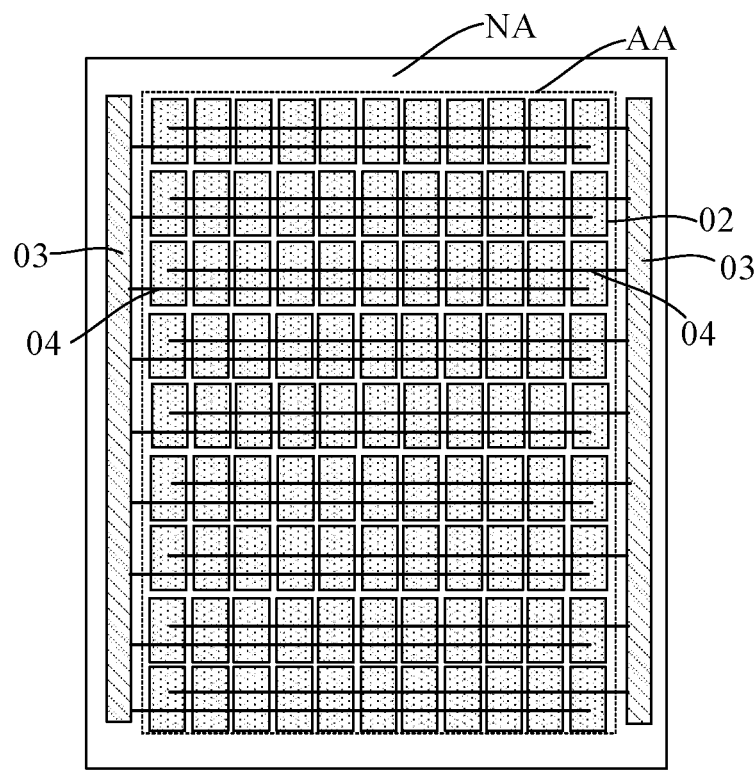
FIG. 1 is a schematic diagram of a display panel in the related art.

FIG. 1 is a schematic diagram of a display panel in the related art. As shown in FIG. 1, the display panel includes a pixel circuit 02, a driving circuit 03 and a light-emitting element (not shown in FIG. 1), and the light-emitting element is connected to the pixel circuit 02. The driving circuit 03 is configured to drive the pixel circuit 02. The display panel is provided with gate lines 04. The pixel circuit 02 is connected to the driving circuit 03 through the gate line 04. Normally, the pixel circuit 02 and the light-emitting element are arranged in a display region AA, and the driving circuit 03 is arranged in a non-display region NA, that is, in a frame region. FIG. 1 shows that driving circuits 03 are provided at a right side and a left side of the frame region of the display region AA. With the driving circuit 03, the pixel circuit 02 cannot be arranged very close to an edge of the display panel, thereby leading to the frame region of the display panel.

In order to solve the problems in the related art, an embodiment of the present disclosure provides an arrangement of the driving circuit, in which at least one of the shift registers in the driving circuit is arranged in the display region, and the pixel circuit is arranged at an outer side of the shift register close to the display panel. In this way, an area of the non-display region can be reduced, the frame can be narrowed, and a connection distance between the light-emitting element and the pixel circuit at an edge of the display region can also be reduced, thereby avoiding that the connection line occupies too much space to affect the wiring in the panel.

Figure 2:
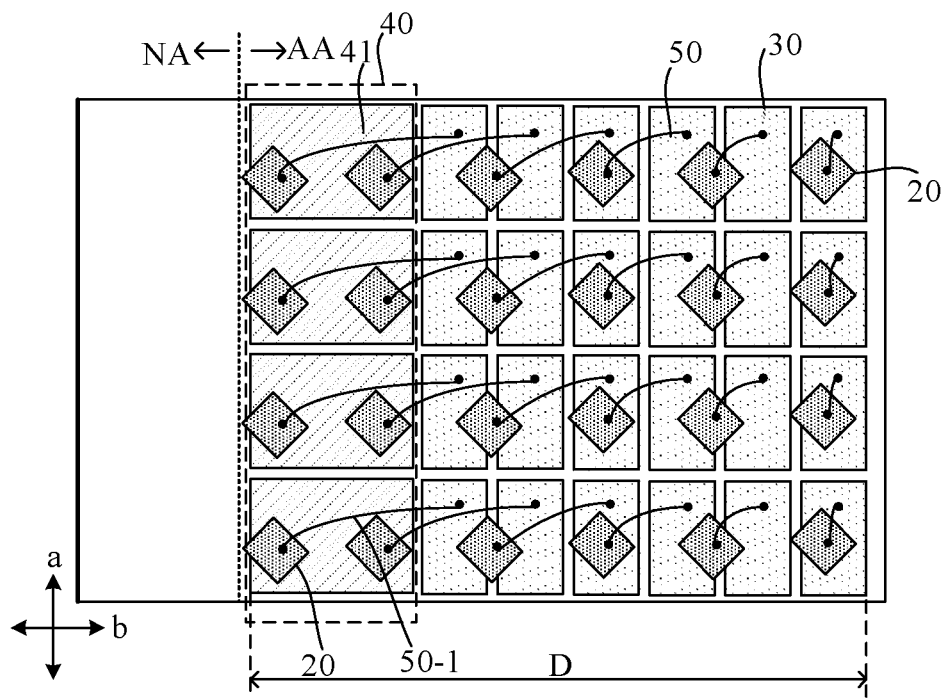
FIG. 2 is a partial schematic diagram of a display panel according to an embodiment of the present disclosure.

FIG. 2 is a partial schematic diagram of a display panel according to an embodiment of the present disclosure. In a solution provided by an embodiment of the present disclosure, as shown in FIG. 2, the display panel includes light-emitting elements 20, pixel circuits 30, and a driving circuit 40. The light-emitting elements 20, the pixel circuits 30, and the driving circuit 40 are located at a same side of a substrate (not shown in FIG. 2). The substrate is a carrier structure, and the substrate can be a flexible substrate or a rigid substrate. A region where the light-emitting elements 20 are located is a display region AA, and area region except the display region AA is a non-display region NA. The light-emitting element 20 overlaps with the driving circuit 40, and the driving circuit 40 is arranged in the display region AA, so that a width of the non-display region NA can be reduced. FIG. 2 shows that the driving circuit 40 includes shift registers 41, and the shift registers 41 in the display region AA are arranged along a first direction a. A second direction b intersects the first direction a. In an example, the second direction b is perpendicular to the first direction a. In the display region AA, the pixel circuits 30 are arranged in pixel circuit columns in the first direction a, and the pixel circuits 30 are arranged in pixel circuit rows in the second direction b. In the display region AA shown in FIG. 2, a total width occupied by the driving circuit 40 and six pixel circuit columns in the second direction b is D. In an example, one pixel circuit 30 drives one light-emitting element 20, the driving circuit 40 is arranged in the display region AA, and the light-emitting element 20 overlaps with the driving circuit 40. In this configuration, the number of the pixel circuits 30 is not increased, therefore, the light-emitting element 20 and the pixel circuit 30 connected to the light-emitting element 20 are staggered from each other, so that the light-emitting element 20 overlaps with the driving circuit 40 in the display region AA. When the light-emitting element 20 overlaps with the pixel circuit 30 driving the light-emitting element 20, it is usually considered that the light-emitting element 20 and the pixel circuit 30 connected to the light-emitting element 20 are not staggered from each other; and when the light-emitting element 20 does not overlap with the pixel circuits 30 driving the light-emitting element 20, it is usually considered that the light-emitting element 20 and the pixel circuits 30 connected to the light-emitting element 20 are staggered from each other. It can be seen from FIG. 2 that the light-emitting element 20 overlapping with the driving circuit 40 and the pixel circuit 30 connected to the light-emitting element 20 are staggered from each other in the second direction b. FIG. 2 schematically shows a connection line 50 between the pixel circuit 30 and the light-emitting element 20. The light-emitting element 20 overlapping with the driving circuit 40 is connected to a corresponding pixel circuit 20 through a first connection line 50-1. It can be seen that a length of the first connection line 50-1 between the light-emitting element 20 overlapping with the driving circuit 40 and the pixel circuit 20 is relatively large.

Figure 3:
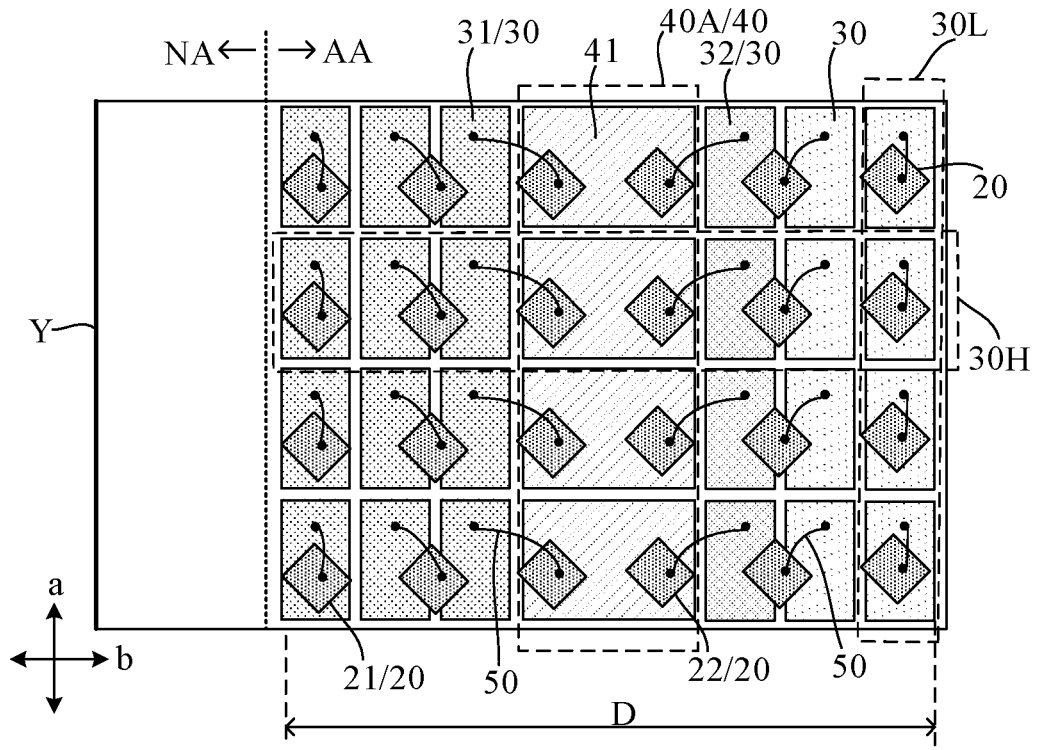
FIG. 3 is a partial schematic diagram of another display panel according to an embodiment of the present disclosure.

An embodiment of the present disclosure provides another display panel. FIG. 3 is a partial schematic diagram of another display panel according to an embodiment of the present disclosure. As shown in FIG. 3, the display panel includes light-emitting elements 20, pixel circuits 30, and a driving circuit 40. The light-emitting element 20 is connected to the pixel circuit 30 through a connection line 50, and the driving circuit 40 includes shift registers 41. The driving circuit 40 is configured to drive the pixel circuit 30. The display panel includes a gate line (not shown in FIG. 3), and the pixel circuit 30 is connected to the driving circuit 40 through the gate line. The display panel has a display region AA and a non-display region NA. The light-emitting elements 20 are arranged in the display region AA. The non-display region NA at least partially surrounds the display region AA. The pixel circuits 30 include a first pixel circuit 31. The driving circuit 40 includes a first driving circuit 40A. The first pixel circuit 31 and at least one shift register 41 of the first driving circuit 40A are arranged in the display region AA. That is, in the display region AA, there is at least one light-emitting element 20 overlapping with the shift register 41 of the first driving circuit 40A. In the display region AA: the first pixel circuit 31 is arranged at a side of the shift register 41 of the first driving circuit 40A close to an edge Y of the display panel, which is an outer edge of the display panel formed after a cutting process. The edge Y of the display panel is also an outline of an outer edge of the display panel. In the embodiments of the present disclosure, there is no limitation on the number of the first pixel circuits 31 arranged at the side of the shift register 41 in the display region AA close to the edge Y of the display panel, and the case shown in FIG. 3 is merely schematic.

The light-emitting element 20 in the display panel is connected to the pixel circuit 30 through the connection line 50, so that the pixel circuit 30 drives the light-emitting element 20. Each of FIG. 2 and FIG. 3 is a schematic partial top view of the display panel, and a direction of the top view is perpendicular to a direction of a plane of the substrate of the display panel. It can be understood that when the light-emitting element 20 overlaps with the pixel circuit 30 connected to the light-emitting element 20, a length of the connection line 50 between the two is relatively small; and when the light-emitting element 20 and the pixel circuit 30 connected to the light-emitting element 20 are staggered from each other, as a distance between the two are staggered from each other with a larger distance, the length of the connection line 50 between the two is larger. It can be seen from FIG. 2 that, when the driving circuit 40 is arranged in display region AA and the light-emitting element 20 overlaps with the driving circuit 40, although a space of the non-display region NA that would be occupied by the driving circuit 40 can be reduced and the frame can be narrowed, a length of the first connection line 50-1 between the light-emitting element 20 overlapping with the driving circuit 40 and the pixel circuit 30 is quite large due to that the two are staggered from each other with a large distance.

In an embodiment of the present disclosure shown in FIG. 3, the first pixel circuit 31 is arranged at the side of the shift register 41 in the display region AA close to the edge Y of the display panel, and the first pixel circuit 31 is located in the display region AA. FIG. 3 shows that the shift registers 41 in the display region AA are arranged in a first direction a. A second direction b intersects the first direction a. The pixel circuits 30 in the display region AA are arranged in pixel circuit rows 30H in the second direction b, and the pixel circuits 30 in the display region AA are arranged in pixel circuit columns 30L in the first direction a. In an embodiment shown in FIG. 3, the pixel circuit 30 is also arranged at a side of the shift register 41 in the display region AA away from the edge Y of the display panel. That is, in the second direction b, the pixel circuit 30 is arranged at each of a left side and a right side of the shift register 41 in the display region AA. That is, the shift register 41 in the display region AA is arranged in the pixel circuit row 30H. For example, three pixel circuit columns 30L are arranged at the left side of the first driving circuit 40A, and three pixel circuit columns 30L are arranged at the right side of the first driving circuit 40A. In this case, in the display region AA shown in FIG. 3: in the second direction b, a total width occupied by the first driving circuit 40A and the six pixel circuit columns 30L is D. In an embodiment shown in FIG. 3, the first driving circuit 40A is arranged between the pixel circuits 30 in the display region AA. When at least one shift register 41 of the first driving circuit 40A is added in the display region AA, for the light-emitting element 20 overlapping with the first driving circuit 40A in the display region AA, the light-emitting element 20 overlaps with and is staggered from the pixel circuit 30 connected to the light-emitting element 20.

In an embodiment shown in FIG. 3, the pixel circuits 30 are arranged at a left side and a right side of the first driving circuit 40A in the display region AA in the second direction b. In this case, the light-emitting element 20 overlapping with the first driving circuit 40A can be connected to the first pixel circuit 31 located at the left side of the first driving circuit 40A, or the light-emitting element 20 overlapping with the first driving circuit 40A can be connected to the first pixel circuit 31 located at the right side of the first driving circuit 40A. In an embodiment shown in FIG. 2, the light-emitting element 20 overlapping with the driving circuit 40 is driven by the pixel circuit 30 located at one side of the driving circuit 40; and in an embodiment shown in FIG. 3, the light-emitting element 20 overlapping with the first driving circuit 40A is respectively driven by the pixel circuit 30 located at each of the left side and the right side of the first driving circuit 40A. Wiring of the connection line 50 in the embodiment shown in FIG. 3 is more flexible. Compared with the embodiment shown in FIG. 2, the light-emitting element 20 and the pixel circuit 30 overlapping with the first driving circuit 40A are staggered from each other with a smaller distance in the embodiment shown in FIG. 3, therefore, a length of the connection line 50 between the light-emitting element 20 and the pixel circuit 30 is relatively small. In this way, a voltage drop on the connection line 50 can be reduced, and the complexity of wiring of the connection line 50 can also be reduced, thereby reducing the process difficulty.

For the display panel provided by the embodiments of the present disclosure, at least one shift register 41 of the first driving circuit 40A is arranged in the display region AA, and the first pixel circuit 31 is arranged at the side of the shift register 41 in the display region AA close to the edge Y of the display panel 31. The embodiments of the present disclosure can reduce the space of the non-display region NA that would be occupied by the driving circuit 40, thereby narrowing the frame in the non-display region NA, increasing an area of the display region AA and increasing a screen ratio. In the embodiments of the present disclosure, the light-emitting element 20 and the pixel circuit 30 connected to the light-emitting element 20 are staggered from each other with a reduced distance, so that a length of the connection line 50 between the light-emitting element 20 and the pixel circuit 30 is relatively small, thereby reducing the complexity of wiring of the connection line 50 and thus reducing the processing difficulty. In addition, a small length of the connection line 50 between the light-emitting element 20 and the pixel circuit 30 can also reduce a voltage drop on the connection line 50, thereby balancing a load difference between different light-emitting elements 20 to improve the display uniformity.

As shown in FIG. 3, the light-emitting elements 20 includes a first light-emitting element 21, and the first light-emitting element 21 is connected to the first pixel circuit 31. In the direction perpendicular to the plane of the substrate, at least one first light-emitting element 21 at least partially overlaps with the first pixel circuit 31; and/or at least one first light-emitting element 21 at least partially overlaps with the first driving circuit 40A. The first light-emitting element 21 is a light-emitting element close to the edge Y of the display panel, and the first pixel circuit 31 is a pixel circuit close to the edge Y of the display panel. Both the first light-emitting element 21 and the first pixel circuit 31 are close to the edge Y of the display panel, so that the first light-emitting element 21 and the first pixel circuit 31 are staggered from each other with a relatively small distance, and a length of the connection line 50 between the two is relatively small, thereby reducing the complexity of wiring of the connection line 50 and thus reducing the processing difficulty.

Figure 4:
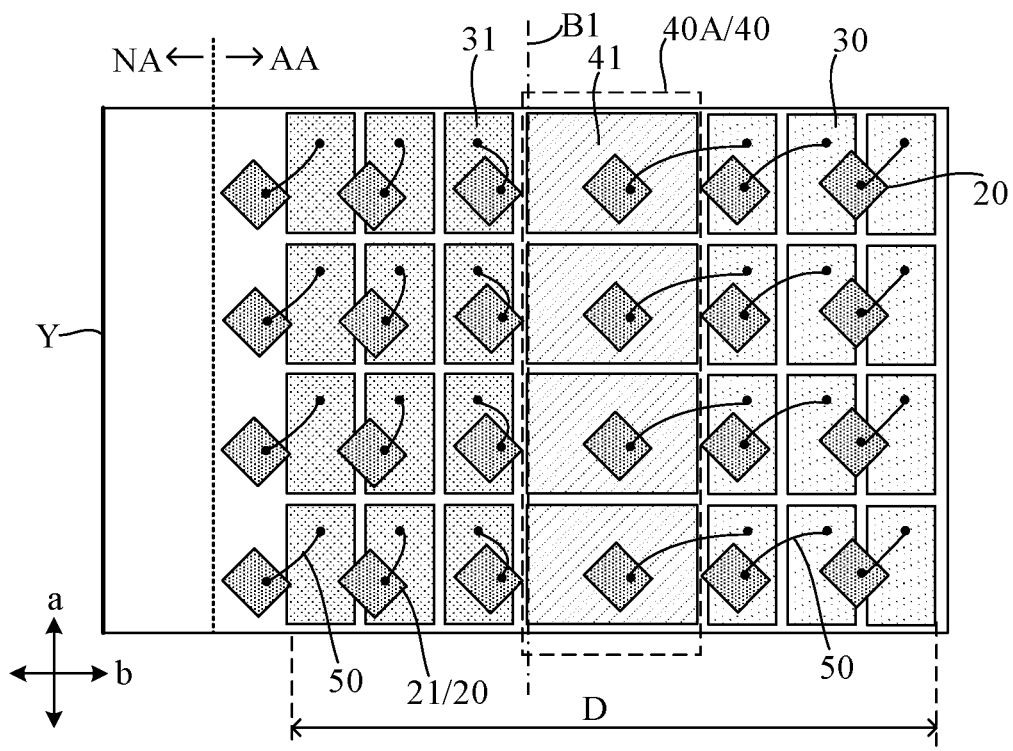
FIG. 4 is a partial schematic diagram of another display panel according to an embodiment of the present disclosure.

In the embodiment shown in FIG. 3, at least one first light-emitting element 21 at least partially overlaps with the first pixel circuit 31, and at least one first light-emitting element 21 at least partially overlaps with the first driving circuit 40A. FIG. 4 is a partial schematic diagram of another display panel according to an embodiment of the present disclosure. In another embodiment, as shown in FIG. 4, the first light-emitting element 21 only overlaps with the first pixel circuit 31. In the display region AA: in the second direction b, a total width occupied by the first driving circuit 40A and six pixel circuit columns is D. In this embodiment, a distance between adjacent first light-emitting elements 21 in the second direction b can be appropriately increased, so that the first light-emitting element 21 is displaced close to the edge Y of the display panel. In the embodiment shown in FIG. 4, the light-emitting element 20 at a side of the first driving circuit 40A in the display region AA close to the edge Y of the display panel overlaps with the first pixel circuit 31, and an overlapping position where the light-emitting element 20 overlaps with the first driving circuit 40A in the display region AA has a certain distance from a first edge B1, which is an edge of the first driving circuit 40A in the display region AA close to the edge Y of the display panel in a width direction of the first driving circuit 40A (the second direction b shown in FIG. 4). Compared with the embodiment shown in FIG. 2, the light-emitting element 20 overlapping with the first driving circuit 40A and the pixel circuit 30 at a right side thereof are staggered from each other with a smaller distance in the embodiment shown in FIG. 4. In the embodiment shown in FIG. 4, the light-emitting element 20 overlapping with the first driving circuit 40A and the pixel circuit 30 are staggered from each other with a reduced distance, thereby reducing a length of the connection line 50 between the light-emitting element 20 and the pixel circuit 30, and thus reducing the complexity of wiring of the connection line 50 and reducing the processing difficulty.

Figure 5:
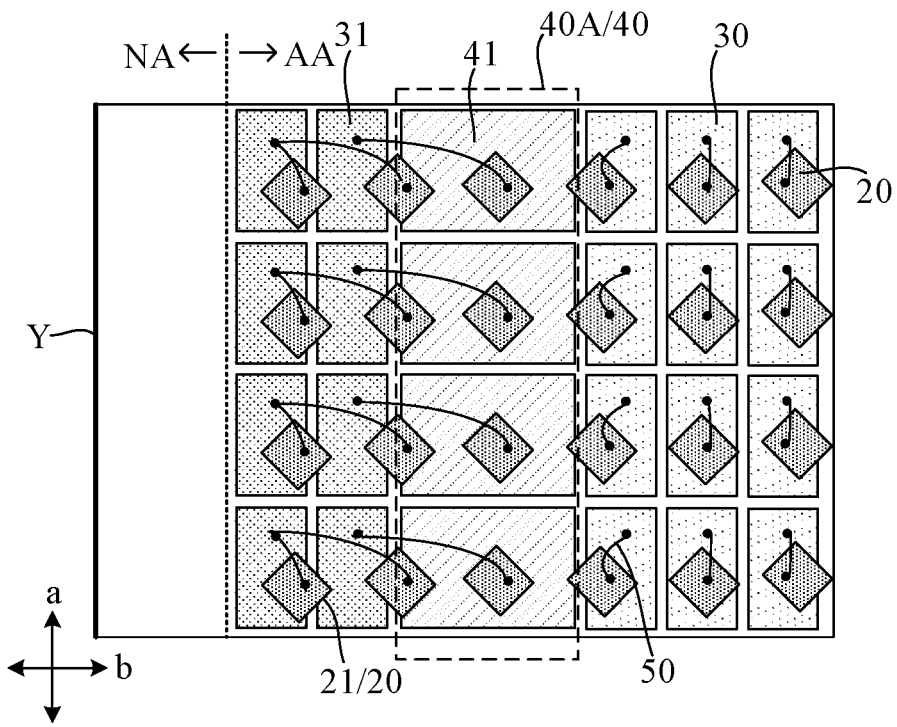
FIG. 5 is a partial schematic diagram of another display panel according to an embodiment of the present disclosure.

In the embodiment shown in FIG. 3, one first pixel circuit 31 drives a respective one first light-emitting element 21. FIG. 5 is a partial schematic diagram of another display panel according to an embodiment of the present disclosure. In another embodiment, as shown in FIG. 5, each of at least one first pixel circuit 31 is connected to two first light-emitting elements 21. When at least one shift register 41 of the first driving circuit 40A is arranged in the display region AA, the shift register 41 occupies a space for arranging the pixel circuit 30. In this embodiment, the first pixel circuit 31 drives two first light-emitting elements 21, so that the number of the first pixel circuits 31 can be reduced to reserve a space for arranging the first driving circuit 40A, thereby reducing a distance with which the light-emitting element 20 overlapping with the first driving circuit 40A and the pixel circuit 30 are staggered from each other, and thus reducing a length of the connection line 50 between the two. Therefore, the complexity of wiring of the connection line 50 can be reduced, thereby reducing the processing difficulty.

In an embodiment, as shown in FIG. 3, the light-emitting elements 20 include a second light-emitting element 22, and the pixel circuits 30 include a second pixel circuit 32. The second light-emitting element 22 is connected to the second pixel circuit 32. In the display region AA, the second pixel circuit 32 is located at a side of the first driving circuit 40A away from the edge Y of the display panel; at least one second light-emitting element 22 at least partially overlaps with the first driving circuit 40A. In the embodiment shown in FIG. 3, at least one first light-emitting element 21 at least partially overlaps with the first driving circuit 40A in the display region AA, and at least one second light-emitting element 22 overlaps with the first driving circuit 40A. For the light-emitting elements 20 overlapping with the first driving circuit 40A, these light-emitting elements 20 are respectively driven by the pixel circuits 30 located at two sides of the first driving circuit 40A in the second direction b. In this case, a distance with which the first light-emitting element 21 and the first pixel circuit 31 are staggered from each other is relatively small, and a distance with which the second light-emitting element 22 and the second pixel circuit 32 are staggered from each other is relatively small.

Therefore, a length of the connection line 50 between each light-emitting element 20 and the corresponding pixel circuit 30 is relatively small. Such a configuration can reduce the complexity of wiring of the connection line 50, thereby reducing the processing difficulty. Moreover, a voltage drop on the connection line 50 can be reduced, thereby balancing the load difference between different light-emitting elements 20 to improve the display uniformity.

Figure 6:
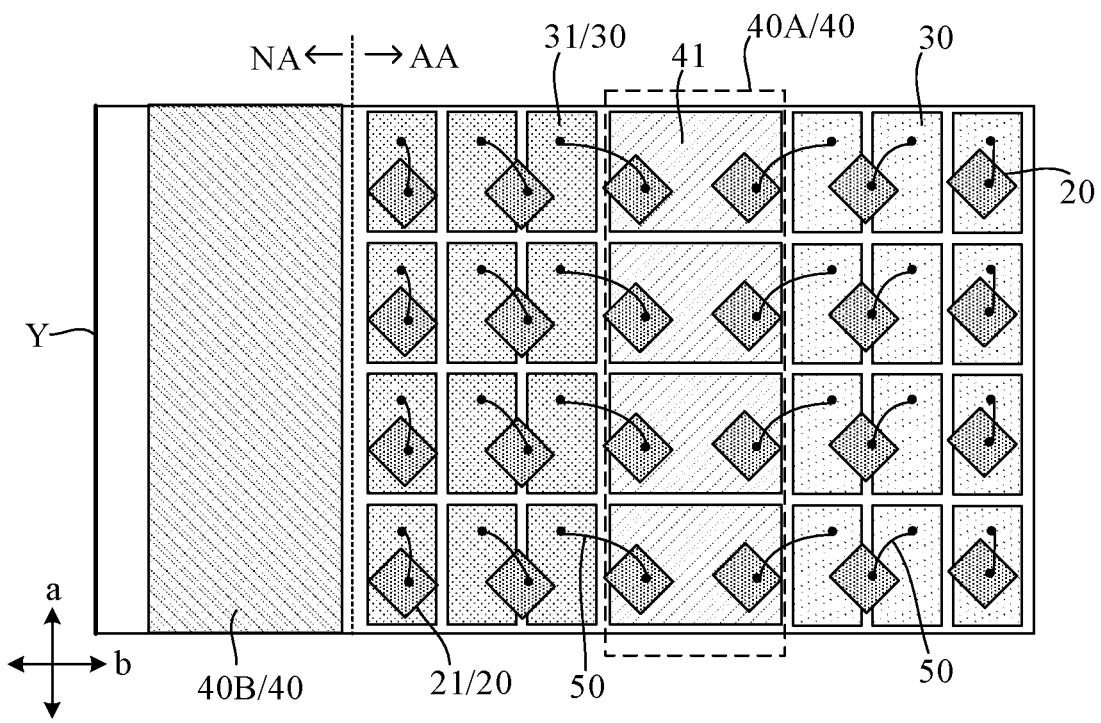
FIG. 6 is a partial schematic diagram of another display panel according to an embodiment of the present disclosure.

FIG. 6 is a partial schematic diagram of another display panel according to an embodiment of the present disclosure. In an embodiments, as shown in FIG. 6, the display panel has a non-display region NA at least partially surrounding the display region AA, and the driving circuit 40 includes a second driving circuit 40B located in the non-display region NA. The second driving circuit 40B is located between the first pixel circuit 31 and the edge Y of the display panel. The second driving circuit 40B also includes shift registers (not shown in FIG. 6). In a conventional display panel, each of the first driving circuit 40A and the second driving circuit 40B is located in the non-display region NA at a side of the display region AA, resulting in a large width of the frame in the non-display region NA. In the embodiments of the present disclosure, at least one shift register 41 of the first driving circuit 40A is arranged in the display region AA and the second driving circuit 40B is arranged in the non-display region NA, so that the width of the frame in the non-display region NA can be reduced, thereby increasing the screen ratio; moreover, since the first pixel circuit 31 is also provided between the first driving circuit 40A in the display region AA and the second driving circuit 40B, a distance with which the light-emitting element 20 and the pixel circuit 30 connected to the light-emitting element 20 are staggered from each other can be reduced, thereby reducing a length of the connection line 50 between the light-emitting element 20 and the pixel circuit 30, and thus reducing the complexity of wiring of the connection line 50 to reduce the processing difficulty. In addition, in the conventional non-display region NA, functional structures such as electrode contact regions or encapsulation barriers need to be provided, and a space of the non-display region NA occupied by these functional structures cannot be reduced. In the embodiments of the present disclosure, the second driving circuit 40B can be arranged to overlap with the functional structures in the non-display region NA, to make reasonable use of the space of the non-display region NA. The technical scheme in which the second driving circuit 40B overlaps with the functional structures in the non-display region NA will be described in the following embodiments.

Figure 7:
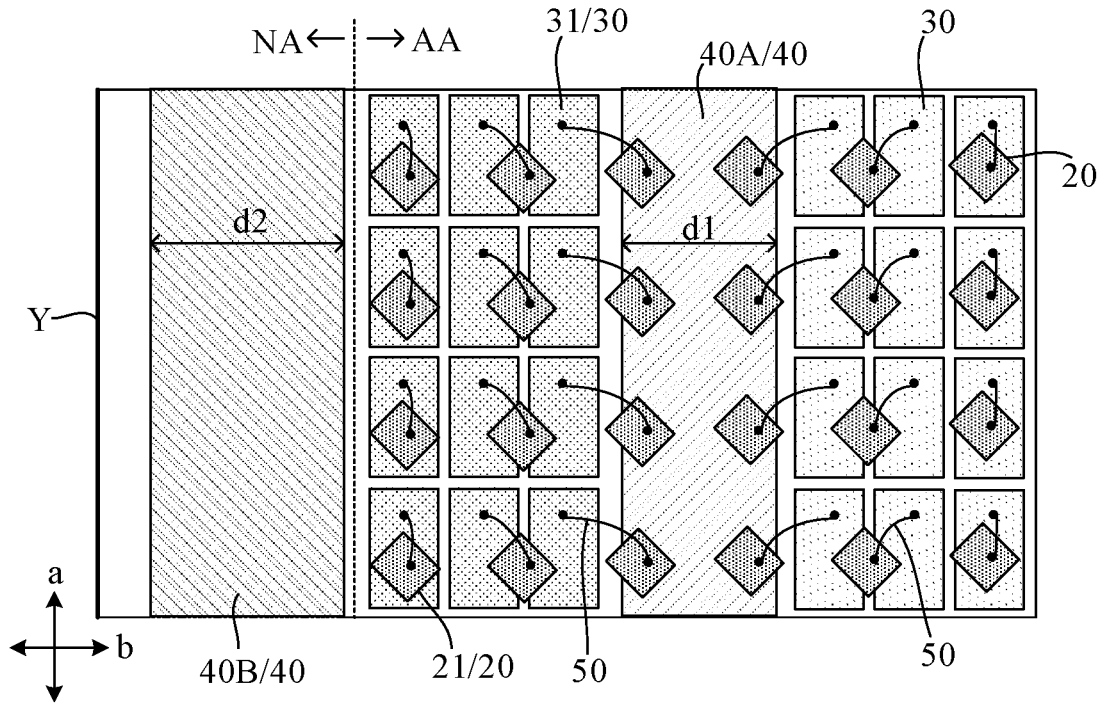
FIG. 7 is a partial schematic diagram of another display panel according to an embodiment of the present disclosure.

FIG. 7 is a partial schematic diagram of another display panel according to an embodiment of the present disclosure. In an embodiment, as shown in FIG. 7, the first driving circuit 40A in the display region AA extends along the first direction a, and the second driving circuit 40B in the non-display region NA extends along the first direction a. The first driving circuit 40A located in the display region AA includes shift registers arranged along the first direction a, and the second driving circuit 40B includes shift registers arranged along the first direction a. In the second direction b, a width of the first driving circuit 40A in the display region AA is a first width d1, a width of the second driving circuit 40B is a second width d2, and the first width d1 is smaller than the second width d2. Compared with the second driving circuit 40B, the width of the first driving circuit 40A in the second direction b is smaller. At least one shift register of the first driving circuit 40A is arranged in the display region AA, so that a distance between the light-emitting element 20 overlapping with the first driving circuit 40A and the pixel circuit 30 are staggered from each other, thereby reducing a length of the connection line 50 between the two, and thus reducing the complexity of wiring of the connection line 50.

In the embodiments of the present disclosure, the display panel includes a pixel circuit, and the pixel circuit includes a transistor and a capacitor. The pixel circuit at least includes a driving transistor, a data writing transistor, a gate reset transistor, and a light-emitting control transistor. For example, the pixel circuit includes seven transistors and one capacitor.

Figure 8:
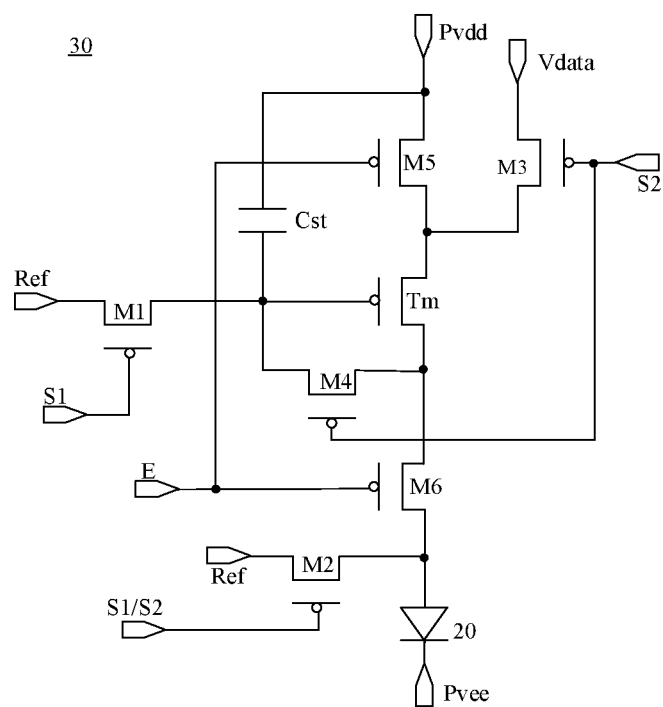
FIG. 8 is a schematic diagram of a pixel circuit according to an embodiment of the present disclosure.

FIG. 8 is a schematic diagram of a pixel circuit according to an embodiment of the present disclosure. In an embodiment, as shown in FIG. 8, the pixel circuit 30 includes a driving transistor Tm, a gate reset transistor M1, an electrode reset transistor M2, a data writing transistor M3, a threshold compensation transistor M4, a first light-emitting control transistor M5, a second light-emitting control transistor M6, and a storage capacitor Cst. A first electrode of the gate reset transistor M1 receives a reset signal Ref, a second electrode of the gate reset transistor M1 is connected to a gate electrode of the driving transistor Tm, and a gate electrode of the gate reset transistor M1 receives a first scan signal S1. A first electrode of the data writing transistor M3 receives a data signal Vdata, and a second electrode of the data writing transistor M3 is connected to the first electrode of a first electrode of the driving transistor Tm. The threshold compensation transistor M4 is connected in series between the gate electrode of the driving transistor Tm and a second electrode of the driving transistor Tm. Each of a gate electrode of the data writing transistor M3 and a gate electrode of the threshold compensation transistor M4 receives a second scan signal S2. The driving transistor Tm is connected in series between the first light-emitting control transistor M5 and the second light-emitting control transistor M6. Each of a gate electrode of the first light-emitting control transistor M5 and a gate electrode of the second light-emitting control transistor M6 receives a light-emitting control signal E. In addition, each of a first electrode of the storage capacitor Cst and a first electrode of the first light-emitting control transistor M5 receives a positive power supply signal Pvdd. A second electrode of the second light-emitting control transistor M6 is connected to a first electrode of the light-emitting element 20. A second electrode of the light-emitting element 20 receives a negative power supply signal Pvee. A first electrode of the electrode reset transistor M2 receives a reset signal Ref, a second electrode of the electrode reset transistor M2 is connected to the first electrode of the light-emitting element 20, and a gate electrode of the electrode reset transistor M2 receives a first scan signal S1 or a second scan signal S2.

FIG. 8 shows that each transistor in the pixel circuit is a p-type transistor. In other embodiments, at least one of the transistors in the pixel circuit is an n-type transistor, which is not shown in the figures herein.

An operation process of the pixel circuit at least includes a gate reset stage, a data writing stage, and a light-emitting stage. In the gate reset stage, the gate reset transistor M1 is turned on to reset the gate electrode of the driving transistor Tm. In the data writing stage, the data writing transistor M3 and the threshold compensation transistor M4 are turned on, and a data voltage is written into the gate electrode of the driving transistor Tm. In the light-emitting stage, the first light-emitting control transistor M5 and the second light-emitting control transistor M6 are turned on, and a driving current is generated under control of a potential of the gate electrode of the driving transistor Tm and is supplied to the light-emitting element 20.

The display panel includes a scan driving circuit, and the scan driving circuit includes shift registers that are cascaded. The scan driving circuit provides a scan signal to the pixel circuit. The shift registers in the scan driving circuit can be any structure that can realize a signal shift function. FIG. 8 shows that the gate reset transistor M1 and the data writing transistor M3 have a same transistor type, then the first scan signal S1 and the second scan signal S2 are provided by two shift registers that are cascaded.

In another embodiment, the reset transistor M1 and the threshold compensation transistor M4 are n-type transistors, and the other transistors are p-type transistors. The gate electrode of the reset transistor M1 and the gate electrode of the data writing transistor M3 are connected to different scan driving circuits. In an embodiment, at least two scan driving circuits are provided in the display panel. The display panel includes a light-emitting driving circuit, which includes shift registers that are cascaded. The light-emitting driving circuit provides a light-emitting control signal E to the pixel circuit. The shift registers in the light-emitting driving circuit can be any structures that can realize a signal shift function.

Figure 9:
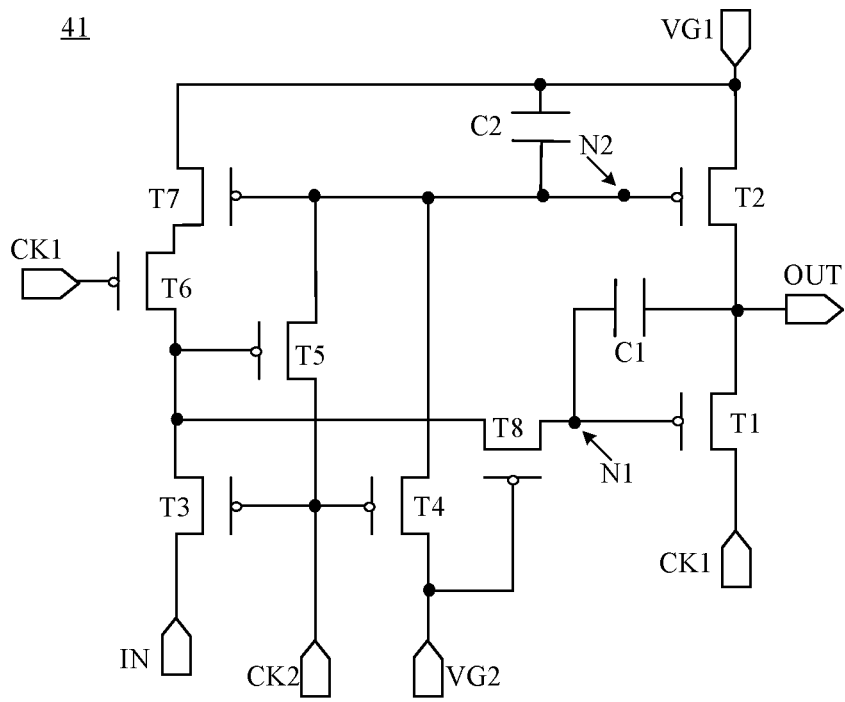
FIG. 9 is a schematic diagram of a shift register according to an embodiment of the present disclosure.

FIG. 9 is a schematic diagram of a shift register according to an embodiment of the present disclosure. In an embodiment, as shown in FIG. 9, the shift register 41 includes a first output transistor T1, a second output transistor T2, a third switch transistor T3, a fourth switch transistor T4, a fifth switch transistor T5, a sixth switch transistor T6, a seventh switch transistor T7, and an eighth switch transistor T8. A control electrode of the first output transistor T1 is connected to a first node N1, a first electrode of the first output transistor T1 receives the first clock signal CK1, and a second electrode of the first output transistor T1 is connected to an output terminal OUT of the shift register 41. A control electrode of the second output transistor T2 is connected to a second node N2, a first electrode of the second output transistor T2 receives a first power voltage signal VG1, and a second electrode of the second output transistor T2 is connected to the output terminal OUT of the shift register 41. Each of a control electrode of the third switch transistor T3 and a control electrode of the fourth switch transistor T4 receives a second clock signal CK2. A first electrode of the third switch transistor T3 is connected to an input terminal IN of the shift register 41, and a second electrode of the third switch transistor T3 is connected to the first node N1. A first electrode of the fourth switch transistor T4 receives a second power voltage signal VG2, and a second electrode of the fourth switch transistor T4 is connected to the second node N2. In an example, the first power supply voltage signal VG1 is a high-level signal, and the second power supply voltage signal VG2 is a low-level signal. A control electrode of the fifth switch transistor T5 is connected to the second electrode of the third switch transistor T3, a first electrode of the fifth switch transistor T5 receives the second clock signal CK2, and a second electrode of the fifth switch transistor T5 is connected to the second node N2. A control electrode of the sixth switch transistor T6 receives the first clock signal CK1, a first electrode of the sixth switch transistor T6 is connected to the control electrode of the fifth switch transistor T5, and a second electrode of the sixth switch transistor T6 is connected to a first electrode of the seventh switch transistor T7. A control electrode of the seventh switch transistor T7 is connected to the second node N2, and a second electrode of the seventh switch transistor T7 receives the first power voltage signal VG1. A control electrode of the eighth switch transistor T8 receives the second power voltage signal VG2, a first electrode of the eighth switch transistor T8 is connected to the second electrode of the third switch transistor T3, and a second electrode of the eighth switch transistor T8 is connected to the first node N1. That is, the second electrode of the third switch transistor T3 is connected to the first node N1 through the eighth switch transistor T8. The shift register 41 includes a first capacitor C1 and a second capacitor C2. A first electrode of the first capacitor C1 is connected to the first node N1, and a second electrode of the first capacitor C1 is connected to the output terminal OUT of the shift register 41. A first electrode of the second capacitor C2 receives a first power voltage signal VG1, and a second electrode of the second capacitor C2 is connected to the second node N2.

Figure 10:
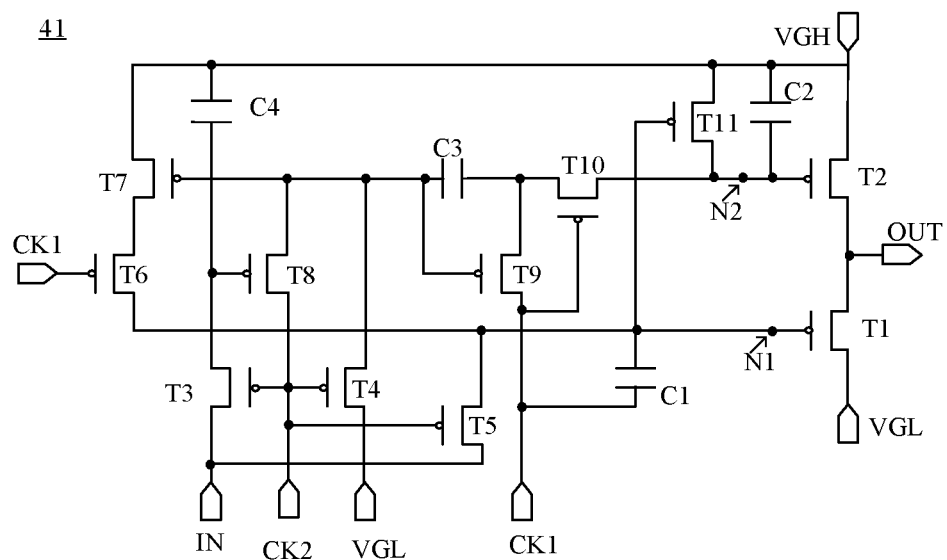
FIG. 10 is a schematic diagram of another shift register according to an embodiment of the present disclosure.

FIG. 10 is a schematic diagram of another shift register according to an embodiment of the present disclosure. In an embodiment, as shown in FIG. 10, the shift register 41 includes eleven transistors T1 to T11, and the shift register includes a first capacitor C1, a second capacitor C2, a third capacitor C3, a fourth capacitor C4, a first node N1, and a second node N2. A control electrode of the first transistor T1 is connected to the first node N1, a first electrode of the first transistor T1 receives a second power voltage signal VG2, a control electrode of the second transistor T2 is connected to the second node N2, and a first electrode of the second transistor T2 receives a first power voltage signal VG1. In an example, the first power voltage signal VG1 is a high-level signal, and the second power voltage signal VG2 is a low-level signal. Each of a second electrode of the first transistor T1 and a second electrode of the second transistor T2 is connected to the output terminal OUT of the shift register. A control electrode of the sixth transistor T6, a control electrode of the tenth transistor T10, a first electrode of the ninth transistor T9, and an electrode of the first capacitor C1 all receive the first clock signal line CK1. A control electrode of the third transistor T3, a control electrode of the fourth transistor T4, a control electrode of the fifth transistor T5, and a first electrode of the eighth transistor T8 all receive the second clock signal CK2. A first electrode of the third transistor T3 and a first electrode of the fifth transistor T5 Coupled to the input terminal IN of the shift register, the first electrode of the fourth transistor T4 receives the second power voltage signal VG2.

In some embodiments, the scan driving circuit includes at least two shift registers 41, each of which is as shown in the embodiment shown in FIG. 9, and the light-emitting driving circuit includes at least two shift registers 41, each of which is as shown in the embodiment shown in FIG. 10. The shift register 41 of the light-emitting driving circuit includes eleven transistors, and the shift register 41 of the scan driving circuit includes eight transistors. Then, an area occupied by the shift register 41 of the scan driving circuit is smaller than an area occupied by the shift register 41 of the light-emitting driving circuit. Therefore, a width of the first driving circuit 40A in the second direction b is smaller. The first driving circuit 40A includes the scan driving circuit, the second driving circuit 40B includes the scan driving circuit, and at least one shift register of the first driving circuit 40A is arranged in the display region AA, so that a distance with which the light-emitting element 20 overlapping with the first driving circuit 40A and the pixel circuit 30 are staggered from each other can be reduced, thereby reducing a length of the connection line 50 between the two, and thus reducing the complexity of wiring of the connection line 50.

Figure 11:
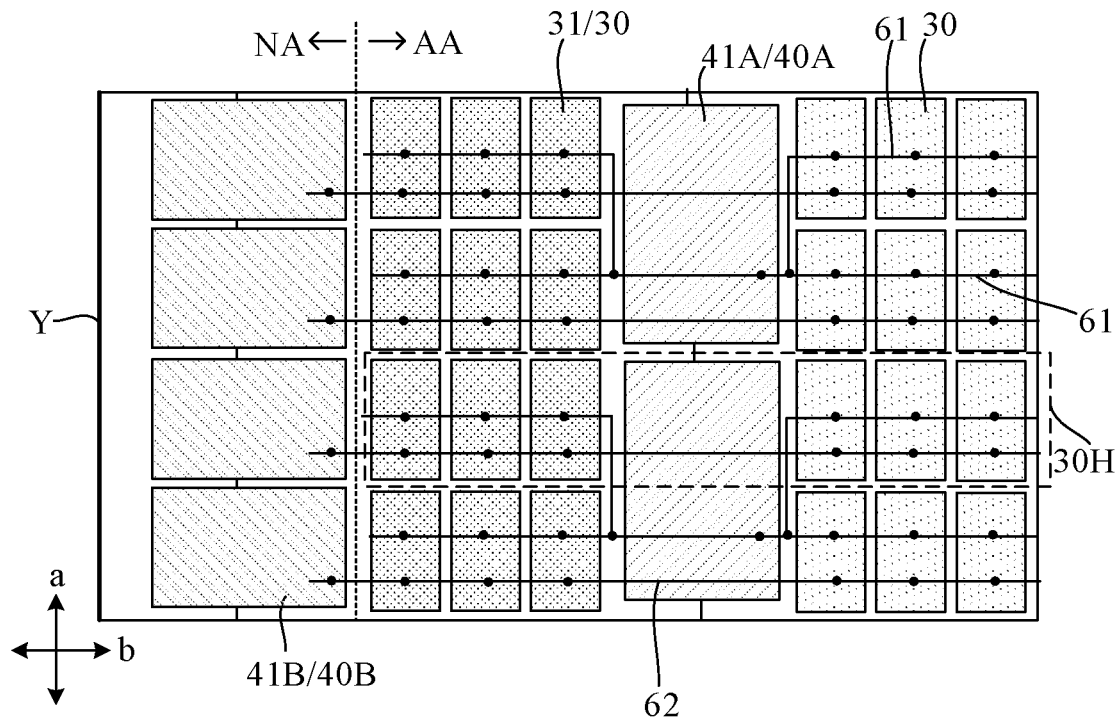
FIG. 11 is a partial schematic diagram of another display panel according to an embodiment of the present disclosure.

FIG. 11 is a partial schematic diagram of another display panel according to an embodiment of the present disclosure. In an embodiment, in order to clearly illustrate a driving connection relationship between the driving circuit and the pixel circuit 30, the light-emitting element 20 in the display region AA is not shown in FIG. 11. As shown in FIG. 11, the first driving circuit 40A includes shift registers 41A that are cascaded, and the second driving circuit 40B includes shift registers 41B that are cascaded. The display panel includes a first gate line 61 and a second gate line 62. The pixel circuit 30 is connected to the shift register 41A of the first driving circuit 40A through the first gate line 61, and the pixel circuit 30 is connected to the shift register 41B of the second driving circuit 40B through the second gate line 62. The pixel circuits 30 in the display region AA are arranged in a pixel circuit row 30H in the second direction b. One shift register 41A drives the pixel circuits 30 in two pixel circuit rows 30H, and one shift register 41B drives the pixel circuits 30 in one pixel circuit row 30H. In this embodiment, one shift register 41A of the first driving circuit 40A drives two pixel circuit rows 30H, so that the number of shift registers 41A of the first driving circuit 40A can be reduced, thereby reducing a width of the first driving circuit 40A in the display region AA in the second direction b. In this way, it is beneficial to reducing a distance with which the light-emitting element 20 overlapping with the first driving circuit 40A and the pixel circuit 30 are staggered from each other, thereby reducing a length of the connection line 50 between the light-emitting element 20 and the pixel circuit 30, and thus reducing the complexity of wiring of the connection line 50 to reduce the processing difficulty.

In an embodiment shown in FIG. 11, the first driving circuit 41A includes a light-emitting driving circuit, and the second driving circuit 41B includes a scan driving circuit. With reference to the pixel circuit shown in FIG. 8, the first gate line 61 provides a light-emitting control signal E, and the second gate line 62 provides a scan signal S1/S2. The light-emitting driving circuit adopts a driving manner in which one shift register drives two pixel circuit rows, that is, the light-emitting driving circuit adopts a driving manner of one-driving-two. The scan driving circuit adopts a driving manner in which one shift register drives two pixel circuit rows, that is, the scan driving circuit adopts a driving manner of one-driving-one. It can be understood from the description of the working principle of the pixel circuit in the embodiment shown in FIG. 8. When the scan driving circuit adopts a driving manner of one-driving-one, two adjacent pixel circuit rows are respectively driven two cascaded shift registers, and the gate reset stages of the pixel circuits belonging to the adjacent pixel circuit rows are respectively performed, and the data writing stages of the pixel circuits belonging to the adjacent pixel circuit rows are also respectively performed. However, when the light-emitting driving circuit adopts a driving manner of one-driving-two, and the light-emitting stages of the pixel circuits belonging to the adjacent pixel circuit rows are simultaneously performed, and the light-emitting elements 20 controlled by the adjacent two pixel circuit rows can normally emit light without affection. Meanwhile, the number of the shift registers of the light-emitting driving circuit can be reduced, and a width occupied in the second direction b can be reduced. At least one of the shift registers of the light-emitting driving circuit is arranged in the display region AA, so that a distance with which the light-emitting element 20 overlapping the light-emitting driving circuit in the display region AA and the pixel circuit 30 are staggered from each other can be reduced, thereby reducing a length of the connection line 50 between the light-emitting element 20 and the pixel circuit 30, and thus reducing the complexity of wiring of the connection line 50 to reduce the processing difficulty.

Figure 12:
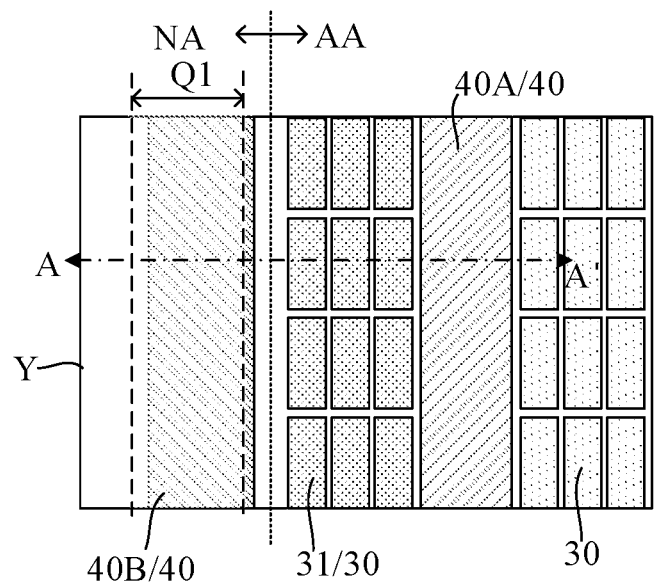
FIG. 12 is a partial schematic diagram of another display panel according to an embodiment of the present disclosure.
Figure 13:
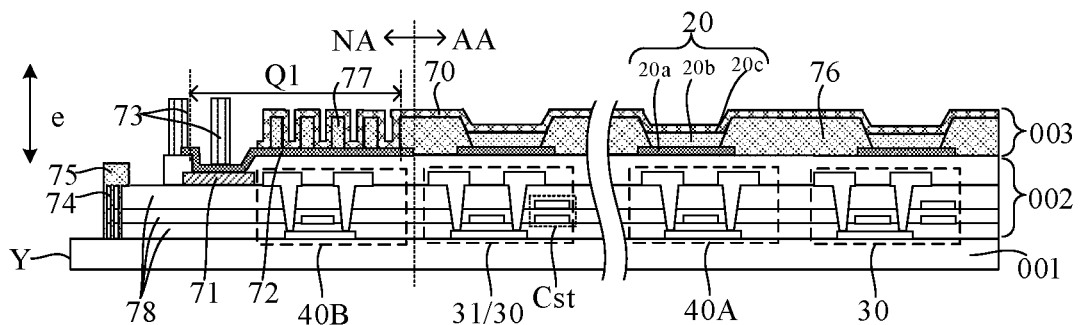
FIG. 13 is a schematic cross-sectional view along A-A' shown in FIG. 12.

FIG. 12 is a partial schematic diagram of another display panel according to an embodiment of the present disclosure. FIG. 13 is a schematic cross-sectional view along A-A' shown in FIG. 12. In FIG. 12, in order to clearly illustrate a positional relationship between the pixel circuit 30 and the driving circuit 40, the light-emitting element in the display region AA is not shown. With reference to FIG. 12 and FIG. 13, the non-display region NA of the display panel includes an electrode contact region Q1; the light-emitting element 20 includes a first electrode 20a, a light-emitting layer 20b, and a second electrode 20c; the second electrodes 20c of multiple light-emitting elements 20 are connected to each other to form a common electrode 70; the common electrode 70 extends from the display region AA to the non-display region NA; and in the electrode contact region Q1, the common electrode 70 is connected to a power supply bus 71. A voltage signal is provided to the common electrode 70 through the power supply bus 71 in the non-display region NA. In a direction e perpendicular to the plane of the substrate 001, the electrode contact region Q1 at least partially overlaps with the second driving circuit 40B. In this embodiment, the electrode contact region Q1 and the second driving circuit 40B located in the non-display region NA at least partially overlap with each other, thereby saving a space of the non-display region NA, and thus being beneficial to narrowing the frame.

As shown in FIG. 13, the display panel includes an array layer 002 and a display layer 003 that are located at a side of the substrate 001. The first driving circuit 40A, the second driving circuit 40B, and the pixel circuit 30 are located in the array layer 002. The storage capacitor Cst in the pixel circuit 30 is also schematically shown in FIG. 13. The light-emitting element 20 is located in the display layer 003. The display layer 003 includes a pixel definition layer 76, and the pixel definition layer 76 is configured to separate adjacent light-emitting elements 20 from one another.

It can be seen from FIG. 13 that the electrode contact region Q1 is provided with an insulation part 77, and the insulating part 77 has a hollow. The common electrode 70 is electrically connected to a connection metal 72 in the hollow of the insulating part 77, and the connection metal 72 is then electrically connected to the power supply bus 71. In this way, the common electrode 70 is connected to the power supply bus 71 through the connection metal 72. In an example, the insulation part 77 and the pixel definition layer 76 are formed in a same layer and made of a same material, and the connection metal 72 and the first electrode 20a are formed in a same layer and made of a same material. FIG. 13 shows that the power supply bus 71 is located at a side of the second driving circuit 40B close to the edge Y of the display panel.

In an example, the display panel includes an encapsulation layer, and the encapsulation layer is located at a side of the display layer 003 away from the substrate 001. The encapsulation layer includes at least one inorganic encapsulation layer and at least one organic encapsulation layer. As shown in FIG. 13, an encapsulation barrier 73 is provided in the non-display region NA, and the encapsulation barrier 73 is configured to limit an encapsulation boundary of the encapsulation layer. Two encapsulation barriers 73 are schematically shown in FIG. 13.

The display panel includes an insulation layer. For example, three insulation layers 78 in the array layer 002 are schematically shown in FIG. 13. At the edge Y of the display panel, the insulation layer 78 shrinks inward relative to the edge Y of the display panel, that is, the insulation layer 78 close to the edge Y of the display panel is cut to form a recess. With such a configuration, the edge of the display panel can be thinned, and a cutting thickness in a process of cutting the edge of the display panel can be reduced, thereby reducing the energy used in the cutting process while improving the cutting precision.

In some embodiments, as shown in FIG. 13, an anti-crack recess 74 is provided in the non-display region NA. The anti-crack recess 74 penetrate through at least part of the insulation layer in the array layer 002. In an example, an organic material 75 is filled in the anti-crack recess 74. In an embodiment, the organic material 75 is the same as the material of the pixel definition layer 76.

Figure 14:
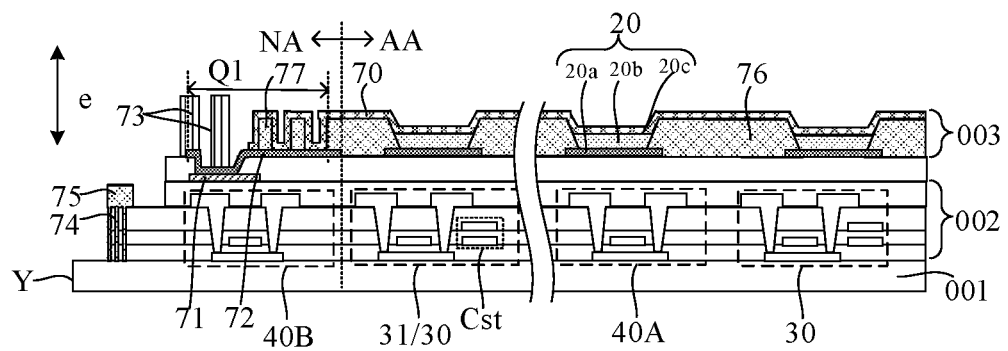
FIG. 14 is a schematic cross-sectional view of another display panel according to an embodiment of the present disclosure.

FIG. 14 is a schematic cross-sectional view of another display panel according to an embodiment of the present disclosure. In an embodiment, as shown in FIG. 14, in the direction e perpendicular to the plane of the substrate 001, the encapsulation barrier 73 and the second driving circuit 40B at least partially overlaps with each other. The encapsulation barrier 73 and the second driving circuit 40B can at least partially overlap with each other by reducing the width of the electrode contact region Q1, so that the space of the non-display region NA can be saved, and the frame can be narrowed.

As shown in FIG. 14, the power supply bus 71 is located at a side of the second driving circuit 40B away from the substrate 001, and the common electrode 70 is connected to the power supply bus 71 through the connection metal 72. In some embodiments, the array layer 002 includes a semiconductor layer and at least four metal layers, and an active layer of each transistor in the circuit structure is located in the semiconductor layer. For example, the first metal layer, the second metal layer, the third metal layer, and the fourth metal layer are sequentially arranged in a direction away from the substrate 001. A gate electrode of the transistor is located in the first metal layer. An electrode of the storage capacitor Cst in the pixel circuit 30 is located in the first metal layer, and another electrode of the storage capacitor Cst in the pixel circuit 30 is located in the second metal layer. A source electrode and a drain electrode of the transistor are located in the third metal layer. The fourth metal layer can be used for wiring in the display region AA, for example, the fourth metal layer is used to form an auxiliary signal line to reduce a resistance of the signal line. In an embodiment, a power supply line for providing a positive power supply signal Pvdd is located in the third metal layer, an auxiliary power supply line is formed in the fourth metal layer, and the auxiliary power supply line is connected in parallel with the power supply line. In this way, the resistance can be reduced, thereby reducing a voltage drop during the transmission of the positive power supply signal Pvdd. In this embodiment, the power supply bus 71 can be arranged in the fourth metal layer, so that the power supply bus 71 can overlap with the second driving circuit 40B, and thus the encapsulation barrier 73 can at least partially overlap with the second driving circuit 40B.

In an embodiment, the display panel includes an auxiliary electrode, which is configured to reduce a voltage drop on the common electrode 70, so as to compensate for the impact on the voltage drop on the common electrode 70 after the width of the electrode contact region Q1 is reduced.

Figure 15:
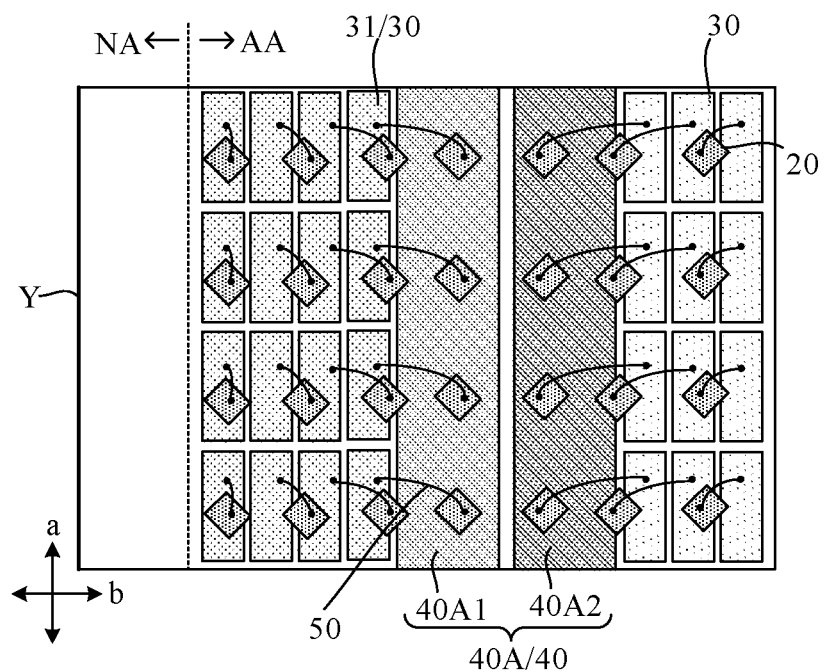
FIG. 15 is a partial schematic diagram of another display panel according to an embodiment of the present disclosure.

FIG. 15 is a partial schematic diagram of another display panel according to an embodiment of the present disclosure. In an embodiment, as shown in FIG. 15, the first driving circuit 40A includes a first driving sub-circuit 40A1 and a second driving sub-circuit 40A2. In the display region AA, no pixel circuit 30 is arranged between the first driving sub-circuit 40A1 and the second driving sub-circuit 40A2. One of the first driving sub-circuit 40A1 and the second driving sub-circuit 40A2 is a scan driving circuit, and the other one of the first driving sub-circuit 40A1 and the second driving sub-circuit 40A2 is a light-emitting driving circuit. In FIG. 15, each of the first driving sub-circuit 40A1 and the second driving sub-circuit 40A2 is represented by a block for schematic illustration. In this embodiment, at least one shift register of the scan driving circuit is arranged in the display region AA, at least one shift register of the light-emitting driving circuit is arranged in the display region AA, and the scan driving circuit and the light-emitting driving circuit in the display region AA are arranged adjacent to each other. In this way, an area of the non-display region NA occupied by the driving circuit can be reduced, thereby narrowing the frame of the display panel. In an embodiment of the present disclosure, the first pixel circuit 31 is provided at a side of the first driving circuit 40A in the display region AA close to the edge Y of the display panel, then the light-emitting element 20 overlapping with the first driving circuit 40A can be driven by the pixel circuits 30 at the left and right sides of the first driving circuit 40A, instead of being driven only by the pixel circuit at one side of the first driving circuit 40A. Such a configuration can reduce a length of the connection line 50 between the light-emitting element 20 and the pixel circuit 30, thereby reducing a voltage drop on the connection line 50, while reducing the complexity of wiring of the connection line 50 to reduce the processing difficulty. In addition, the display region AA may be provided with a signal line extending along the second direction b. When forming the first driving circuit 40A, a layer where the signal line is located may be occupied. As a result, the first driving circuit 40A arranged in the display region AA may affect the wiring of the signal line extending in the second direction b. For example, the first driving circuit 40A makes the signal line extending along the second direction b be disconnected (for example, one signal line is divided into two line segments), and the two line segments formed after being disconnected need to be connected by a bridge line or the like. It is only briefly described herein, and in the following related embodiments, how to connect the signal line that is disconnected by the driving circuit in the display region AA will be described in details. In the embodiment shown in FIG. 15, the first driving sub-circuit 40A1 and the second driving sub-circuit 40A2 in the display region AA are arranged together, and the number of line segments formed after the signal line extending along the second direction b is disconnected is relatively small, thereby simplifying the wiring in display region AA.

Figure 16:
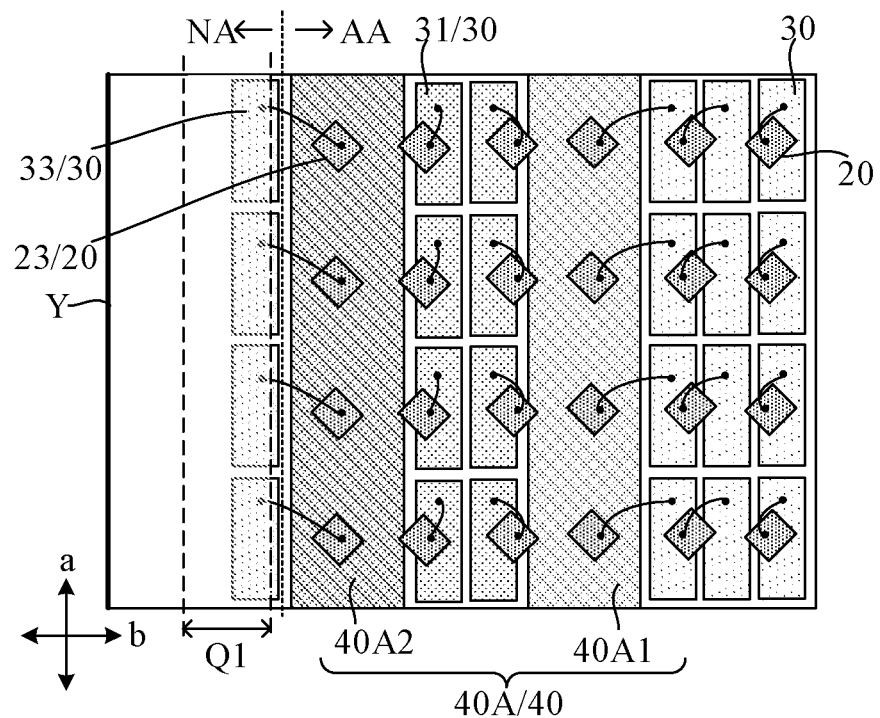
FIG. 16 is a partial schematic diagram of another display panel according to an embodiment of the present disclosure.

FIG. 16 is a partial schematic diagram of another display panel according to an embodiment of the present disclosure. In an embodiment, as shown in FIG. 16, the first driving circuit 40A includes a first driving sub-circuit 40A1 and a second driving sub-circuit 40A2. In the display region AA, the first pixel circuit 31 is provided between the first driving sub-circuit 40A1 and the second driving sub-circuit 40A2. One of the first driving sub-circuit 40A1 and the second driving sub-circuit 40A2 is a scan driving circuit, and the other one of the first driving sub-circuit 40A1 and the second driving sub-circuit 40A2 is a light-emitting driving circuit. In an embodiment, at least one shift register of the first driving sub-circuit 40A1 and at least one shift register of the second-driving sub-circuit 40A2 are arranged in the display region AA, thereby reducing an area of the non-display region NA occupied by the driving circuit, and thus narrowing the frame of the display panel. Moreover, the first pixel circuit 31 is provided between the first driving sub-circuit 40A1 and the second driving sub-circuit 40A2, and the light-emitting element 20 connected to the first pixel circuit 31 can be shifted to the left along the second direction b to overlap with the driving sub-circuit 40A1, or the light-emitting element 20 connected to the first pixel circuit 31 can be shifted to the right along the second direction b to overlap with the second driving sub-circuit 40A2. In this way, a distance with which the light-emitting element 20 and the first pixel circuit 31 are staggered from each other can be smaller, and a length of the connection line between the light-emitting element 20 and the first pixel circuit 31 can be smaller, thereby simplifying the wiring.

In an embodiment, as shown in FIG. 16, in the display region AA, the first driving sub-circuit 40A1 is located at a side of the second driving sub-circuit 40A2 away from the edge Y of the display panel. The pixel circuit 30 includes a third pixel circuit 33 located in the non-display region NA, the light-emitting element 20 includes a third light-emitting element 23, and the third light-emitting element 23 is connected to the third pixel circuit 33. In the direction perpendicular to the plane of the substrate, at least one third light-emitting element 23 partially overlaps with the second driving sub-circuit 40A2. In an embodiment, the second driving sub-circuit 40A2 is provided with pixel circuit 30 at the left and right sides in the second direction b, so that a distance with which the light-emitting element 20 overlapping with the second driving sub-circuit 40A2 and the pixel circuit 30 are staggered from each other can be smaller, thereby being beneficial to reducing a length of the connection line between the light-emitting element 20 and the pixel circuit 30. In addition, as shown in FIG. 16, the non-display region NA includes an electrode contact region Q1, and a structure of the electrode contact region Q1 can be understood with reference to the above-described embodiment shown in FIG. 13. The electrode contact region Q1 at least partially overlaps with the third pixel circuit 33, thereby saving a space of the non-display region NA to narrow the frame.

The driving circuit includes multiple shift registers 41 that are cascaded. An input terminal IN of a first shift register receives a start signal, which is provided by a start signal line; and an output terminal OUT of the first shift register is connected to an input terminal IN of a second shift register and a gate line. That is, an output terminal OUT of an n-th shift register is connected to an input IN of an (n+1)-th shift register and a gate line, where n is an positive integer. In order to achieve driving of the driving circuit, the display panel is provided with a driving signal line, and the shift register is connected to the driving signal line. The driving signal lines at least include a start signal line, two clock signal lines, and two power supply voltage signal lines.

Figure 17:
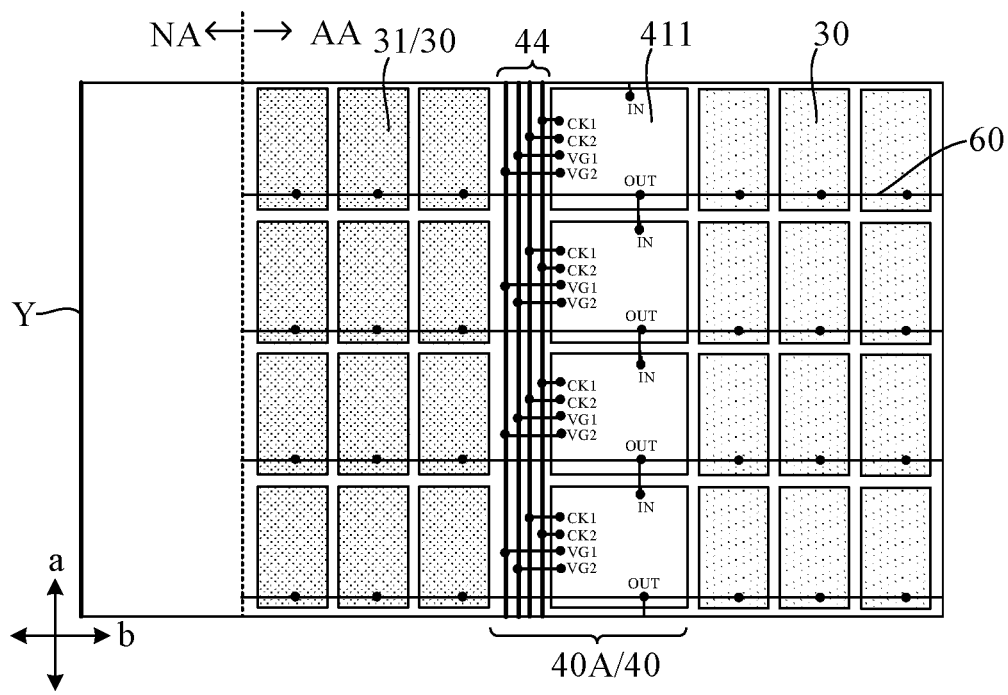
FIG. 17 is a partial schematic diagram of another display panel according to an embodiment of the present disclosure.

FIG. 17 is a partial schematic diagram of another display panel according to an embodiment of the present disclosure. In an embodiment, as shown in FIG. 17, the driving signal line in the first driving circuit 40A includes a first driving signal line 44, the first driving circuit 40A includes a first shift register 411, and the first driving signal line 44 and the first shift register 411 are located in the display region AA. The first shift register 44 is connected to the first driving signal line 44, and the first shift register 411 is connected to multiple pixel circuits 30 through the gate line 60. In the first driving circuit 40A, the first shift register 411 located in the display region AA needs to be connected to the driving signal line, and the first driving signal line 44 is arranged in the display region AA along with the first shift register 411, so that it facilitates that the first shift register 411 is connected to the first driving signal line 44, thereby simplifying the connection between the two. In this way, it can prevent the connection line between the two from being too long and overlapping with the first pixel circuit 31 to result in the complexity of wiring in the display region AA. In addition, it can also prevent the connection line between the two from overlapping with the first pixel circuit 31 to increase a coupling effect.

Figure 18:
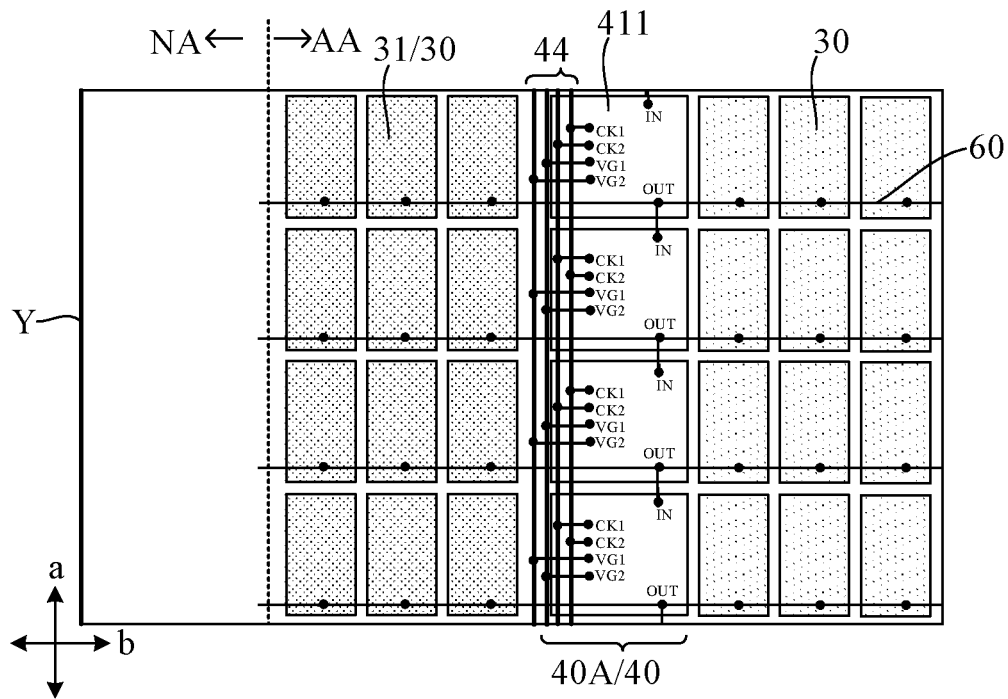
FIG. 18 is a partial schematic diagram of another display panel according to an embodiment of the present disclosure.

FIG. 17 shows four first driving signal lines 44 which include a clock signal line and a power supply voltage signal line. The driving signal lines include a start signal line. In the first driving circuit 40A, only a first shift register needs to be connected to the start signal line. In an embodiment, the start signal line in the first driving circuit 40A is arranged in the non-display region NA. In another embodiment, the first shift register in the first driving circuit 40A is located in the display region AA, and the start signal line is also arranged in the display region AA, so that the first shift register is connected to the start signal line. FIG. 18 is a partial schematic diagram of another display panel according to an embodiment of the present disclosure. FIG. 18 is a top view of the display panel, and it can be understood that the top view direction is the same as the direction perpendicular to the plane of the substrate. In an embodiment, as shown in FIG. 18, at least one first driving signal line 44 partially overlaps with the first shift register 411 in the direction perpendicular to the plane of the substrate. The first shift register 411 includes a transistor and a capacitor. With reference to a layer structure of the display panel shown in FIG. 13, in an example, at least one first driving signal line 44 is located at a side of the first shift register 411 away from the substrate 001, so that the first driving signal line 44 and the second A shift register 411 can overlap with each other. Such a configuration can reduce a width occupied by the first driving circuit 40A in the display region AA in the second direction b, thereby being beneficial to reducing a distance with which the light-emitting element 20 overlapping with the first driving circuit 40A and the pixel circuit 30 are staggered from each other. Therefore, a length of the connection line between the light-emitting element 20 and the pixel circuit 30 can be reduced, thereby simplifying wiring of the connection line.

In an embodiment, the first driving signal line 44 is located in the display region AA, and at least one first driving signal line 44 overlaps with the light-emitting element.

Figure 19:
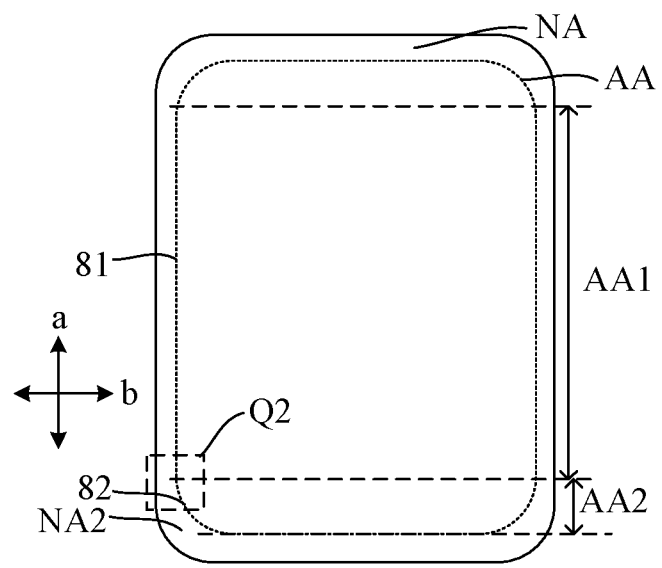
FIG. 19 is a schematic diagram of another display panel according to an embodiment of the present disclosure.
Figure 20:
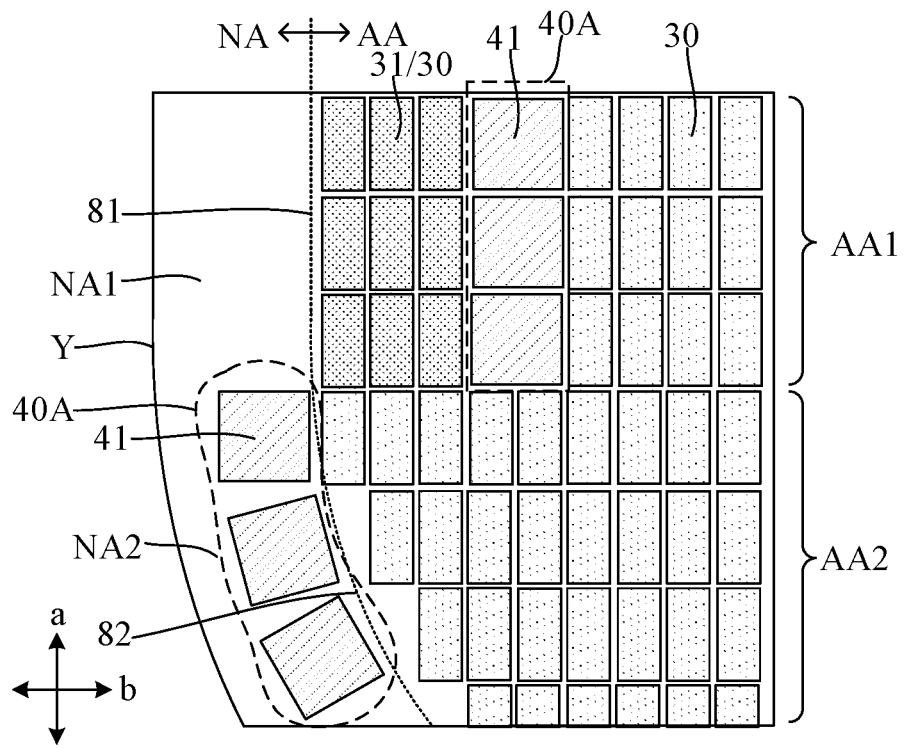
FIG. 20 is an enlarged schematic diagram in a region Q2 shown in FIG. 19.

FIG. 19 is a schematic diagram of another display panel according to an embodiment of the present disclosure. FIG. 20 is an enlarged schematic diagram in a region Q2 shown in FIG. 19. In an embodiment, as shown in FIG. 19, the display region AA includes a first display region AA1 and a second display region AA2. The first display region AA1 includes a straight edge 81 extending along the first direction a. The second display region AA2 is adjacent to the first display region AA1 in the first direction a, and the second display region AA2 includes an arc-shaped edge 82 connected to the straight edge 81. With reference to FIG. 20, at least one shift register 41 of the first driving circuit 40A is located in the first display region AA1. FIG. 20 shows an edge Y of the display panel, which is an outline of an outer edge of the display panel. A positional relationship between the shift register 41 and the pixel circuit 30 in the first display region AA1 can be understood with reference to the above-described embodiments shown in FIG. 3. As shown in FIG. 19, the non-display region NA includes a first non-display region NA1, and the first non-display region NA1 is adjacent to the first display region AA1 in the second direction b. In an embodiment of the present disclosure, the shift register that would be arranged in the first non-display region NA1 in the first driving circuit 40A is actually arranged in the first display region AA1, thereby reducing the width of the frame in the first non-display region NA1.

In addition, in FIG. 20, a difference between a dimension of the pixel circuit 30 in the last row and a dimension of the pixel circuit 30 at other position is caused by the cross section, that is, a whole shape of the pixel circuit 30 is not actually shown in the last row in FIG. 20.

In an embodiment, as shown in FIG. 20, at least one shift register 41 of the first driving circuit 40A is located in the arc-shaped non-display region NA2. The shift register 41 located in the arc-shaped non-display region NA2 is configured to drive the pixel circuit 30 in the second display region AA2. In an example, the shift register 41 located in the display region AA is upright, and at least part of the shift register 41 located in the arc-shaped non-display region NA2 is inclined along with the arc-shaped edge 82. The inclined shift register 41 can be illustrated as follows: a transistor of the shift register 41 located in the arc-shaped non-display region NA2 and a transistor of the shift register 41 located in the display region AA have a same function, and the transistors having the same function have a same channel extension direction. In an embodiment, the shift register of the first driving circuit 40A that is arranged in the first non-display region NA1 is actually arranged in the first display region AA1, thereby reducing the width of the frame in the first non-display region NA1. Moreover, the shift register 41 of the first driving circuit 40A is arranged in the arc-shaped non-display region NA2, without changing an arrangement manner of the driving circuit in the arc-shaped non-display region NA2, thus the complexity of wiring in the second display region AA2 is not increased.

Figure 21:
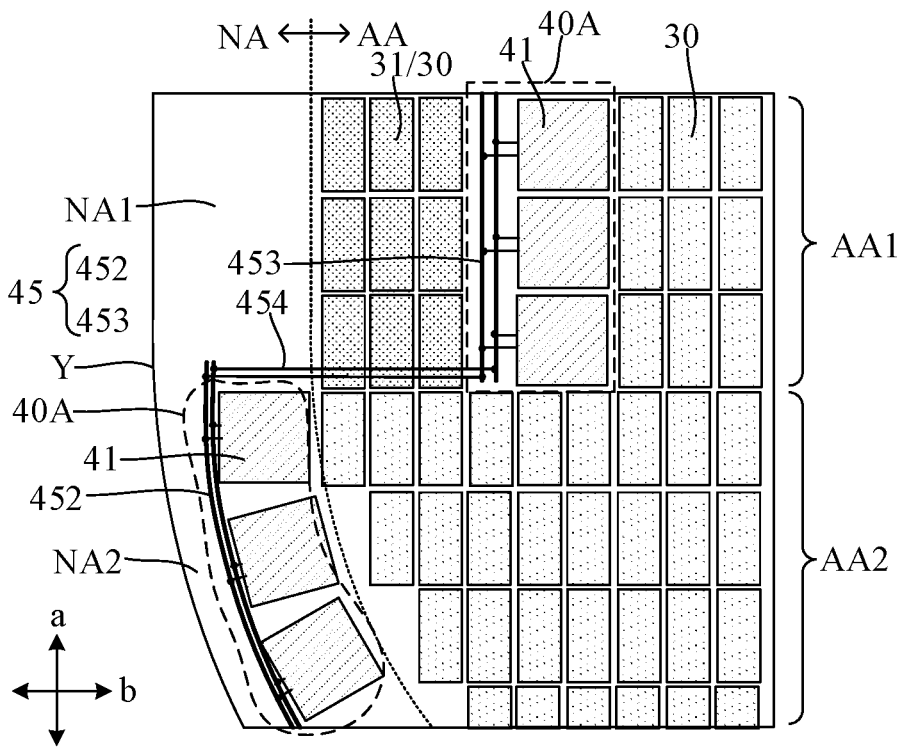
FIG. 21 is another enlarged schematic diagram in a region Q2 shown in FIG. 19.

FIG. 21 is another enlarged schematic diagram in a region Q2 shown in FIG. 19. In an embodiment, as shown in FIG. 21, the driving signal lines in the first driving circuit 40A include a second driving signal line 45, and the second driving signal line 45 includes a second line segment 452 and a third line segment 453 that are connected to each other. The second line segment 452 is located in the arc-shaped non-display region NA2, and the third line segment 453 is located in the first display region AA1. A fourth line segment 454 extends from the non-display region NA to the display region AA, and the second line segment 452 is connected to the third line segment 453 through the fourth line segment 454. In an embodiment, in the first display region AA1, the shift register 41 is electrically connected to the second line segment 452; and in the arc-shaped non-display region NA2, the shift register 41 is electrically connected to the third line segment 453. The second line segment 452 and the third line segment 453 transmit a same signal. The second line segment is arranged in the first display region AA1, thereby facilitating the electrical connection between the shift register 41 in the first display region AA1 and the second line segment 452. The shift register 41 in the first display region AA1 does not need to be provided with a line extending to the non-display region NA to be connected to the second driving signal line 45 in the non-display region NA, thereby simplifying wiring in the display region AA, and avoiding that a line extending to the non-display region NA overlaps with the first pixel circuit 31 to increase the coupling effect.

In an embodiment, the second driving signal line 45 includes a clock signal line. That is, the clock signal line includes a second line segment 452 located in the arc-shaped non-display region NA2 and a third line segment 453 located in the first display region AA1.

In another embodiment, the second driving signal line 45 includes a power supply voltage signal line. That is, the power supply voltage signal line includes a second line segment 452 located in the arc-shaped non-display region NA2 and a third line segment 453 located in the first display region AA1.

Figure 22:
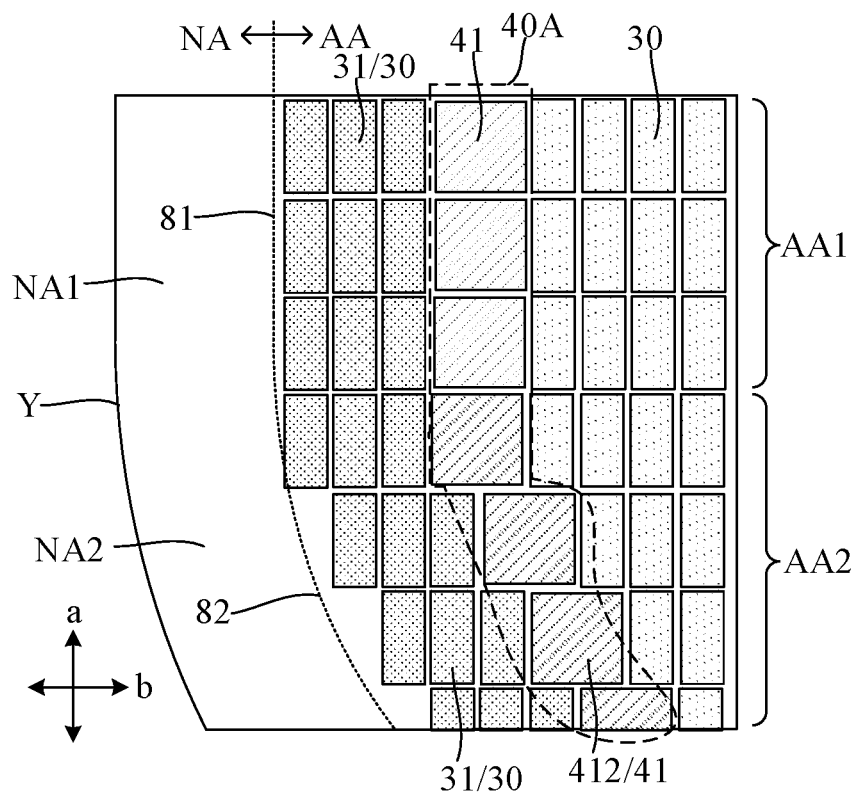
FIG. 22 is another enlarged schematic diagram in a region Q2 shown in FIG. 19.

FIG. 22 is another enlarged schematic diagram in a region Q2 shown in FIG. 19. In an embodiment, as shown in FIG. 22, the second display region AA2 includes an arc-shaped edge 82, and at least one shift register 41 of the first driving circuit 40A is located in the second display region AA2. The first display region AA1 includes a straight edge 81, and at least one shift register 41 of the first driving circuit 40A is located in the first display region AA1. In the second direction b, the first non-display region NA1 is adjacent to the first display region AA1, and the arc-shaped non-display region NA2 is adjacent to the second display region AA2. Such a configuration can reduce a width of the first non-display region AA1, and can also reduce a width of the arc-shaped non-display region NA2. The width of the first non-display region AA1 and the width of the arc-shaped non-display region NA2 are synchronously reduced, thereby improving the aesthetics of the display panel.

As shown in FIG. 22, multiple pixel circuits 30 are arranged in a pixel circuit row (not shown in FIG. 22) in the second direction b. In other words, the pixel circuit row extends in the second direction b, and the pixel circuit row includes multiple pixel circuits 30. Taking the first display region AA1 as an example, after at least one of the shift registers 41 of the first driving circuit 40A is arranged in the first display region AA1, a first pixel circuit 31 is arranged at a side of the shift register 41 located in the first display region AA1 close to an edge of the display panel, and a first pixel circuit 31 is arranged at each of a left side and a right side of the shift register 41 located in the first display region AA1 in the second direction b. That is, the shift register 41 is inserted in the pixel circuit row. The first driving circuit 40A includes multiple second shift registers 412. The second shift registers 412 are located in the second display region AA2. The second shift register 412 does not need to adapt to the shape of the arc-shaped edge 82 to be inclined, and the second shift register 412 can be upright. The second shift register 412 being upright can be illustrated as follows: a transistor of the second shift register 412 and a transistor of the shift register 41 located in the first display region AA1 have a same function, and the transistors having the same function have a same channel extension direction. In the second direction b, the second shift register 412 is aligned with the pixel circuit row. The second shift register 412 being aligned with the pixel circuit row can be understood as follows: the second shift register 412 is inserted in the pixel circuit row that is driven by the second shift register 412. Such a configuration can facilitate the electrical connection between the second shift register 412 and the pixel circuit row that is driven by the second shift register 412.

As shown in FIG. 22, in order to adapt to the shape of the arc-shaped edge 82, the pixel circuits 30 in the second display region AA2 need to be arranged in a stepped shape at a position close to the arc-shaped edge 82. In the first direction a, at least some of adjacent second shift registers 412 are staggered from each other. At least some of adjacent second shift registers 412 that are staggered from each other can be illustrated as follows: an extension direction of a line connecting same points/positions of adjacent second shift registers 412 (for example, same positions of the channels of the transistors having a same function) intersects the first direction a, and an included angle therebetween is not equal to zero. Such a configuration can achieve that the first pixel circuit 31 is arranged at a side of each second shift register 412 close to the arc-shaped edge 82, so that the first pixel circuits 31 can be used to drive the light-emitting element overlapping with the second shift register 412, and thus reducing a distance with which the light-emitting element overlapping with the second shift register 412 and the pixel circuit are staggered from each other. Therefore, a length of the connection line between the light-emitting element overlapping with the second shift register 412 and the pixel circuit can be reduced.

Figure 23:
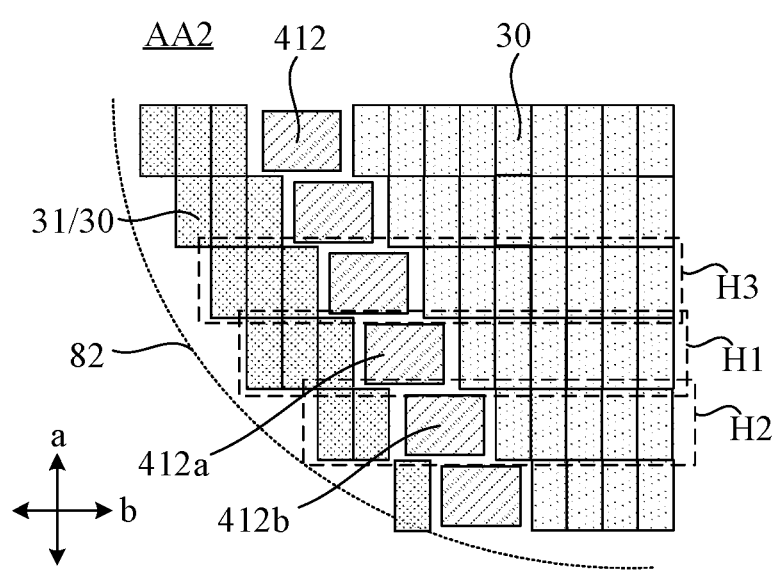
FIG. 23 is a partial schematic diagram of another display panel according to an embodiment of the present disclosure.

FIG. 23 is a partial schematic diagram of another display panel according to an embodiment of the present disclosure. In an embodiment, FIG. 23 schematically shows a partial area of the second display region AA2. As shown in FIG. 23, the second shift registers 412 includes a first shift sub-register 412a and a second shift sub-register 412b. In the second direction b, the number of first pixel circuits 31 between the first shift sub-register 412a and arc-shaped edge 82 is n1, and the number of first pixel circuits 31 between the second shift sub-register 412b and arc-shaped edge 82 is n2, where n1≠n2. In FIG. 23, it is shown that n1=3 and n2=2. That is, for at least two second shift registers 412 in the second display region AA2, the number of first pixel circuits 31 between one of the at least two second shift registers 412 and the arc-shaped edge 82 is different from the number of first pixel circuits 31 between another one of the at least two second shift registers 412 and the arc-shaped edge 82. As shown in FIG. 22, in order to adapt to the shape of the arc-shaped edge 82, the pixel circuits 30 in the second display region AA2 need to be arranged in a stepped shape at a position close to the arc-shaped edge 82, resulting that two adjacent pixel circuit rows are staggered from each other in the second direction b. FIG. 23 shows that a misalignment distance between a first pixel circuit row H1 and a second pixel circuit row H2 in the second direction b is basically equal to a total width of two pixel circuits 30, and the distance with which two adjacent pixel circuit rows are staggered from each other is related to the curvature of the arc-shaped edge 82.

Based on the technical solution provided by the embodiments of the present disclosure, the shift register is arranged in the display region AA, and the first pixel circuit 31 is arranged at a side of the shift register close to the edge of the display panel, thereby reducing a distance with which the light-emitting element and the pixel circuit are staggered from each other. Then, in the second non-display region AA2, the first pixel circuit 31 is arranged at a side of the second shift register 412 close to the arc-shaped edge 82. In some embodiments, a distance with which two adjacent pixel circuit rows are staggered from each other in the second display region AA2 in the second direction b is configured to adapt to the curvature of the arc-shaped edge 82, and the distance with which two adjacent pixel circuit rows are staggered from each other in the second direction b does not have a constant value. For example, as shown in the embodiment shown in FIG. 23, for a third pixel circuit row H3 and a first pixel circuit row H1 that are adjacent to each other, the first pixel circuit row H1 shrinks inward for one pixel circuit 30 relative to the third pixel circuit row H3, in other words, the first pixel circuit row H1 and the third pixel circuit row H3 are staggered from each other by one pixel circuit 30 in the second direction b; and for a first pixel circuit row H1 and a second pixel circuit row H2 that are adjacent to each other, the second pixel circuit row H2 and the first pixel circuit row H1 are staggered from each other by two pixel circuits 30 in the second direction b. In this case, if the number of first pixel circuits 31 between each second shift register 412 and the arc-shaped edge 82 is the same, it may lead to a large distance with which two adjacent second shift registers 412 are staggered from each other in the second direction b, which is adverse to wiring of the two, thereby increasing a space occupied by the wiring and the difficulty of the wiring.

In order to facilitate the cascade connection of two adjacent second shift registers 412, in an embodiment of the present disclosure, the second display region AA2 is provided with a first shift sub-register 412a and a second shift sub-register 412b, and the number of first pixel circuits 31 arranged between the register 412a and the arc-shaped edge 82 is different from the number of first pixel circuits 31 arranged between the type-B second shift register 412b and the arc-shaped edge 82, so that an arrangement of the first pixel circuits 31 at a position of the edge can be adapted to the curvature of the arc-shaped edge 82, while avoiding an extremely large distance with which two adjacent second shift registers 412 are staggered from each other in the second direction b.

Figure 24:
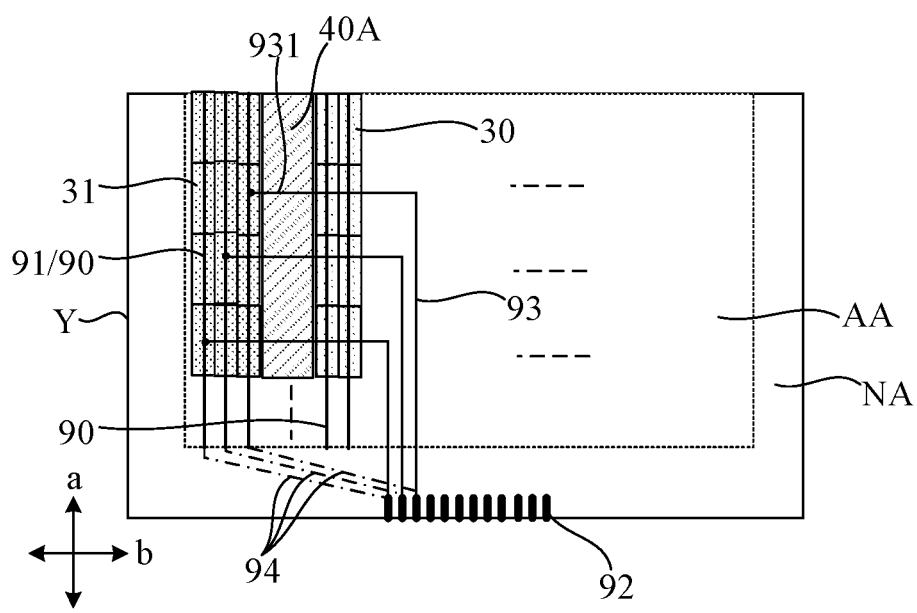
FIG. 24 is a schematic diagram of another display panel according to an embodiment of the present disclosure.

FIG. 24 is a schematic diagram of another display panel according to an embodiment of the present disclosure. FIG. 24 only shows a schematic circuit diagram at a partial position in the display region AA. In an embodiment, as shown in FIG. 24, the display region AA is provided with data lines 90, each of the which extends along the first direction a. With reference to the pixel circuit 30 shown in FIG. 8, the data line 90 provides a data signal Vdata. The data lines 90 include a first data line 91, and the first pixel circuit 31 is connected to the first data line 91. The non-display region NA is provided with pads 92, which are used for binding the driving structure to utilize the driving structure to drive the display panel. In an embodiment of the present disclosure, the first pixel circuit 31 is located at a side of the first driving circuit 40A in the display region AA close to the edge Y of the display panel, then the first data line 91 connected to the first pixel circuit 31 is a data line close to the edge of the display region AA. In a conventional configuration, the first data line 91 is connected to the pad 92 through a fan-out line 94 (shown as a dotted line in FIG. 24) arranged in the non-display region NA, and the fan-out line 94 affects a width of the frame in the non-display region NA where the pad 92 is located. In an embodiment of the present disclosure, the display region AA is provided with a data connection line 93, which includes an end connected to the first data line 91 and another end connected to the pad 92. The first data line 91 is connected to the pad 92 through the data connection line 93 located in the display region AA, thereby reducing the fan-out line in the non-display region NA, and thus being beneficial to reducing a width of the frame in the non-display region NA where the pad 92 is located. As shown in FIG. 24, the data connection line 93 includes a first line segment 931. In the direction perpendicular to the plane of the substrate, at least one first line segment 931 overlaps with the first driving circuit 40A. The display panel can be provided with an electric-conductive layer to form the first line segment 931, thereby making the first line segment 931 not short-circuited with the first driving circuit 40A and any other data line 90.

With reference to the pixel circuit 30 shown in FIG. 8, the display region AA is provided with constant-voltage signal lines, which at least include a reset line and a power supply line. The reset line provides a reset signal Ref, and the power supply line provides a positive power supply signal Pvdd. In an embodiment of the present disclosure, after at least one shift register 41 of the first driving circuit 40A is arranged in the display region AA, partial structures of the constant voltage signal line and the first driving circuit 40A are formed in a same film layer, resulting in that a part of the constant voltage signal line is disconnected by first driving circuit 40A.

Figure 25:
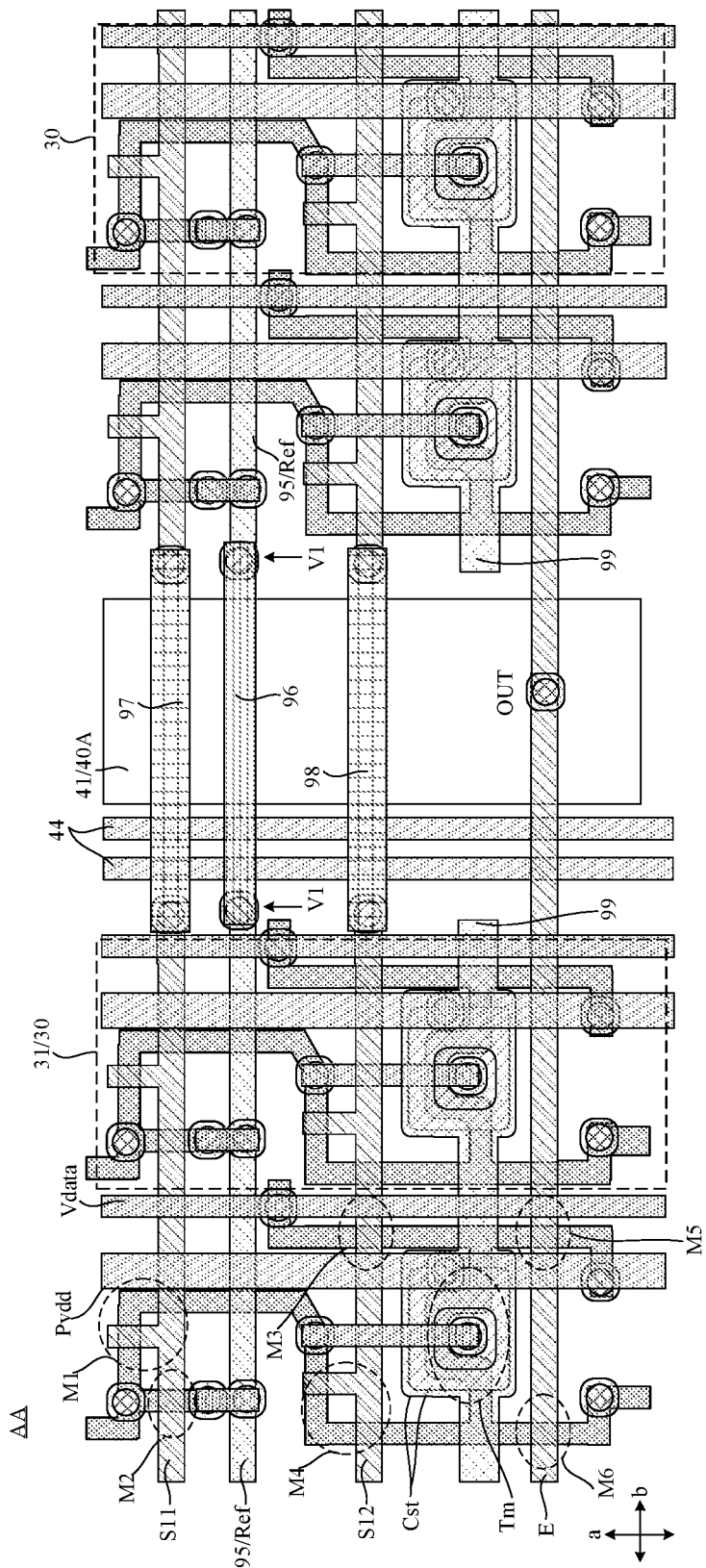
FIG. 25 is a partial schematic diagram of another display panel according to an embodiment of the present disclosure.

FIG. 25 is a partial schematic diagram of another display panel according to an embodiment of the present disclosure. FIG. 25 schematically shows a circuit structure at a partial position in the display region AA. A connection relationship between transistors in the pixel circuit 30 in FIG. 25 can be understood with reference to the pixel circuit shown in FIG. 8. In an embodiment, the display panel includes a data line Vdata, a power supply line Pvdd, a light-emitting control line E, and a reset line Ref. Each signal line and a signal provided by the same are illustrated with a same reference numeral, for example, each of the reset line and the reset signal is illustrated with Ref. The display panel includes a first sub-scan line S11 and a second sub-scan line S12. Each of the first sub-scan line S11 and the second sub-scan line S2 is connected to a respective one of two adjacent shift registers. FIG. 25 schematically shows pixel circuit rows arranged along the second direction b, and one pixel circuit row is provided with one first sub-scan line S11 and one second sub-scan line S12. For example, for two adjacent pixel circuit rows including a first pixel circuit row and a second pixel circuit row, the second sub-scan line S12 corresponding to the first pixel circuit row and the first sub-scan line S11 corresponding to the second pixel circuit row are connected to a same shift register. For one pixel circuit row, the first sub-scan line S11 provides a first scan signal S1 to the gate reset transistor M1 in a pixel circuit 30 in the pixel circuit row, and provides the first scan signal S1 to the electrode reset transistor M2 in the pixel circuit 30 in a previous pixel circuit row; the second sub-scan line S12 provides a second scan signal S2 to each of the data writing transistor M3 and the threshold compensation transistor M4 in the pixel circuit 30 in the pixel circuit row, and the electrode reset transistor in the pixel circuit 30 of the pixel circuit row receives the first scan signal S1 provided by a next first sub-scan line 11. In addition, in an embodiment shown in FIG. 25, a first electrode of the gate reset transistor M1 is connected to the reset line Ref through the electrode reset transistor M2; while the circuit diagram shown in FIG. 8 shows that the gate reset transistor M1 and the electrode reset transistor M2 are respectively connected to the reset line Ref.

As shown in FIG. 25, each of the data line Vdata and power supply line Pvdd extends along the first direction a; and each of the light-emitting control line E, the reset line Ref, the first sub-scan line S11 and the second sub-scan line S12 extends along the second direction b. After at least one shift register 41 of the first driving circuit 40A is arranged in the display region AA, the shift register 41 is arranged between adjacent pixel circuits 30 arranged in the second direction b. FIG. 25 schematically shows first driving signal lines 44 each extending along the first direction a, and the number of the first driving signal lines 44 is merely schematically illustrated. The shift register 41 in the display region AA is connected to the first driving signal line 44. The signal line in the display region AA extending along the second direction b is disconnected by the first driving circuit 40A. Taking the first driving circuit 40A being the light-emitting driving circuit as an example, the shift register 41 in the display region AA is connected to the light-emitting control line E, and the light-emitting control line E located at each of a left side and a right side of the shift register 41 is connected to an output terminal OUT. if the light-emitting control line E intersects and short-circuits with any other signal line when the light-emitting control line E is connected to the output terminal OUT, it is configured that the light-emitting control line E includes a main portion and a bridge portion located in different layers, and the main portion and the bridge portion are connected to each other by a through-hole running through the insulation layer. At a position where the light-emitting control line E intersects any other signal line, the bridge portion is provided to intersect the signal line to avoid short circuit at the intersecting position.

As shown in FIG. 25, the display region AA is provided with a first constant-voltage signal line 95, the pixel circuit 30 is connected to the first constant-voltage signal line 95, and at least part of the first constant-voltage signal line 95 is disconnected by the first driving circuit 40A. The display region AA is also provided with a constant-voltage connection line 96, and two first constant-voltage signal sub-lines of first constant-voltage signal line 95 located at two sides of the first driving circuit 40A are connected to each other through the constant-voltage connection line 96. The first constant-voltage signal line 95 includes the reset line Ref, and two reset sub-lines of the rest line Ref located at two sides of the first driving circuit 40A are connected to each other through the constant-voltage connection line 96. The constant-voltage connection line 96 is electrically connected to the first constant-voltage signal line 95 through a through-hole V1 formed in the insulation layer. The constant-voltage connection line 96 operates as a bridge line connected between two first constant-voltage signal sub-lines of the first constant-voltage signal 95. The constant-voltage connection line 96 crosses the first driving circuit 40A in the second direction b, that is, the constant-voltage connection line 96 overlaps with the first driving circuit 40A. In an example, a layer where the constant voltage connection line 96 is formed is arranged at a side of the first driving circuit 40A away from the substrate, so that the constant voltage connection line 96 is insulated from and overlaps with the first driving circuit 40A. In this embodiment, the constant-voltage connection line 96 is used to connect the first constant-voltage signal line 95 disconnected by the first driving circuit 40A, thereby achieving transmission of the voltage signal on the first constant-voltage signal line 95.

The driving circuit located in the non-display region NA provides a signal to each of the first sub-scan line S11 and the second sub-scan line S12. As shown in FIG. 25, each of the first sub-scan line S11 and the second sub-scan line S12 extending along the second direction b is also disconnected by the first driving circuit 40A. Two first sub-scan sub-lines of the first sub-scan line S11 located at two sides of the first driving circuit 40A are connected to each other through a first scan connection line 97, and two second sub-scan sub-lines of the two second sub-scan line S12 located at two sides of the first driving circuit 40A are connected to each other through a second scan connection line 98. Each of the first scan connection line 97 and the second scan connection line 98 is insulated from and overlaps with the first driving circuit 40A, thereby achieving normal transmission of the scan signal. In an example, the first scan connection line 97 and the second scan connection line 98 are located in the same film layer as the constant-voltage connection line 96.

As shown in FIG. 25, the display panel includes a first auxiliary line 99. One electrode of the storage capacitor Cst is connected to the power supply line Pvdd, and for the electrodes of the capacitors in adjacent pixel circuits 30 arranged in the second direction b, the electrodes of the capacitors connected to the power supply line Pvdd are connected to each other to form the first auxiliary line 99. The first auxiliary line 99 can reduce a voltage drop during transmission of the power supply voltage signal and improve the in-plane uniformity. It can be seen from FIG. 25 that the first auxiliary line 99 is also disconnected by the first driving circuit 40A. In an embodiment, the first constant-voltage signal line 95 includes the first auxiliary line 99, and two first auxiliary sublines of the first auxiliary line 99 located at two sides of the first driving circuit 40A are connected to each other through a constant-voltage connection line 96, which is not shown in the figures herein.

FIG. 25 merely illustrates a case where the signal line extending along the second direction b is cut off by the first driving circuit 40A. In other embodiments, it can be understood with reference to FIG. 22 that in a case where the first driving circuit 40A is arranged in the second display region AA, in order to adapt to the shape of the arc-shaped edge 82, two shift registers 41 cascaded in the second display region AA may be staggered from each other in the second direction b, thereby resulting in that the signal line in the display region extending in the first direction a is disconnected by the first driving circuit 40A. That is, in some embodiments, each of the data line Vdata and power supply line Pvdd extending along the first direction a is disconnected by the first driving circuit 40A. In this case, with reference to the configuration in the embodiment shown in FIG. 25, two signal sub-lines of the signal line located at two sides can be connected to each other by the connection line overlapping with the first driving circuit 40A, thereby achieving signal transmission.

Figure 26:
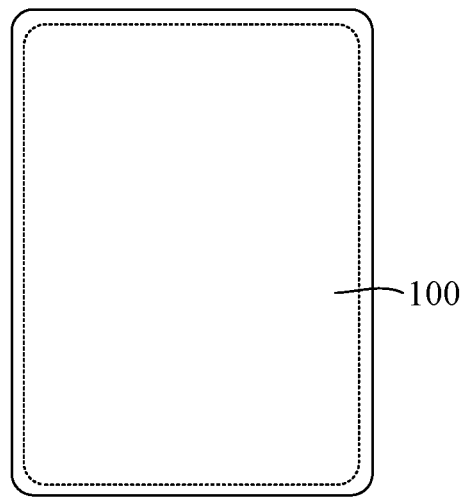
FIG. 26 is a schematic diagram of a display device according to an embodiment of the present disclosure.

An embodiment of the present disclosure provides a display device. FIG. 26 is a schematic diagram of a display device according to an embodiment of the present disclosure. As shown in FIG. 26, the display device includes the display panel 100 provided by any embodiment of the present disclosure. A structure of the display panel 100 has been described in the foregoing embodiments, and will not be repeated herein. The display device provided by the embodiment of the present disclosure may be, for example, a mobile phone, a computer, a tablet, a television, a vehicle display, or an electronic device such as a smart wearable device.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

Finally, it should be noted that, the above-described embodiments are merely for illustrating the present disclosure, but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A display panel, having a display region and comprising:
   a substrate;
   light-emitting elements located in the display region;

pixel circuits; and at least one driving circuit, wherein the light-emitting elements, the pixel circuits, and the at least one driving circuit are located at a side of the substrate;

wherein the light-emitting elements are connected to the pixel circuits, and each of the at least one driving circuit comprises shift registers;

wherein the pixel circuits comprise at least one first pixel circuit, the at least one driving circuit comprises a first driving circuit, and the at least one first pixel circuit and at least one shift register of the shift registers of the first driving circuit are located in the display region;

wherein, in the display region, the at least one first pixel circuit is arranged at sides of the shift registers of the first driving circuit that are close to an edge of the display panel; and wherein the light-emitting elements comprise at least one first light-emitting element connected to the at least one first pixel circuit; and wherein a projection of at least one of the at least one first light-emitting element on a plane of the display panel at least partially overlaps with a projection of at least one of the at least one first pixel circuit on the plane of the display panel or a projection of the first driving circuit on the plane of the display panel.

2. The display panel according to claim 1, wherein in a direction perpendicular to a plane of the substrate, at least one of the at least one first light-emitting element at least partially overlaps with at least one of at least one of the at least one first pixel circuit or the first driving circuit.

3. The display panel according to claim 2, wherein the light-emitting elements further comprise at least one second light-emitting element, and the pixel circuits further comprise at least one second pixel circuit, wherein the at least one second light-emitting element is connected to the at least one second pixel circuit; and wherein in the display region, the at least one second pixel circuit is located at a side of the first driving circuit away from the edge of the display panel; and in the direction perpendicular to the plane of the substrate, at least one of the at least one second light-emitting element at least partially overlaps with the first driving circuit.

4. The display panel according to claim 1, wherein the first driving circuit comprises a first driving sub-circuit and a second driving sub-circuit, wherein, in the display region, none of the at least one first pixel circuit is provided between the first driving sub-circuit and the second driving sub-circuit;

wherein the display panel further has a non-display region at least partially surrounding the display region, wherein, in the display region, the first driving sub-circuit is located at a side of the second driving sub-circuit away from the edge of the display panel;

wherein the pixel circuits further comprises at least one third pixel circuit located in the non-display region, the light-emitting elements further comprise at least one third light-emitting element, and the at least one third light-emitting element is connected to the at least one third pixel circuit; and wherein, in a direction perpendicular to a plane of the substrate, one of the at least one third light-emitting element partially overlaps with the second driving sub-circuit.

5. The display panel according to claim 4, wherein each of the light-emitting elements comprises a first electrode, a light-emitting layer, and a second electrode, wherein the second electrodes of the light-emitting elements are connected to each other to form a common electrode;

wherein the display panel comprises an electrode contact region in which the common electrode is connected to the power supply bus; and wherein, in the direction perpendicular to the plane of the substrate, the electrode contact region at least partially overlaps with the third pixel circuit.

6. The display panel according to claim 1, wherein each of the at least one driving circuit further comprises at least one driving signal line, wherein the shift registers are connected to the at least one driving signal line;

wherein the at least one driving signal line of the first driving circuit comprises a first driving signal line, the shift registers of the first driving circuit comprises a first shift register, and the first driving signal line and the first shift register are located in the display region; and wherein in a direction perpendicular to a plane of the substrate, one of the at least one first driving signal lines partially overlaps with the first shift register.

7. The display panel according to claim 1, further having a non-display region at least partially surrounding the display region, wherein the display panel comprises:

data lines provided in the display region and comprising at least one first data line, the at least one first pixel circuit being connected to the at least one first data line;

pads provided in the non-display region; and at least one data connection line provided in the display region, wherein each of the at least one data connection line comprises an end connected to one of the at least one first data line, and another end connected to one of the pads, and one of the at least one data connection line comprises at least one first line segment, one of the at least one first line segment overlapping with the first driving circuit in a direction perpendicular to a plane of the substrate.

8. The display panel according to claim 1, further comprising:

at least one first constant-voltage signal line provided in the display region, wherein the pixel circuits are connected to the at least one first constant-voltage signal line, and one of the at least one first constant-voltage signal line is cut off by the first driving circuit; and a constant-voltage connection line provided in the display region, and two first constant-voltage signal sub-lines of one of the at least one first constant-voltage signal line located at two sides of the first driving circuit are connected to each other through the constant-voltage connection line.

9. The display panel according to claim 1, wherein the display region comprises a first display region, wherein the first display region has a straight edge extending along a first direction;

wherein at least one shift register of the shift registers of the first driving circuit is located in the first display region;

wherein the display region further comprises a second display region adjacent to the first display region in the first direction, wherein the second display region has an arc-shaped edge connected to the straight edge of the first display region; and wherein the display panel comprises an arc-shaped non-display region adjacent to the arc-shaped edge of the second display region, and at least one shift register of the shift registers of the first driving circuit is located in the arc-shaped non-display region.

10. The display panel according to claim 9, wherein each of the at least one driving circuit further comprises at least one driving signal line, and the shift registers are connected to the at least one driving signal line; and wherein the at least one driving signal line of the first driving circuit comprises a second driving signal line, wherein the second driving signal line comprises a second line segment and a third line segment that are connected to each other, the second line segment is located in the arc-shaped non-display region, and the third line segment is located in the first display region.

11. The display panel according to claim 1, wherein the display region comprises a second display region, wherein the second display region comprises an arc-shaped edge, and at least one shift register of the shift registers of the first driving circuit is located in the second display region;

wherein at least two pixel circuits of the pixel circuits are arranged in a second direction to form each of pixel circuit rows;

wherein the first driving circuit comprises second shift registers located in the second display region; and wherein at least one shift register of the second shift registers is aligned with one of the pixel circuit rows in the second direction.

12. The display panel according to claim 11, wherein at least two adjacent second shift registers of the second shift registers are stagger from each other in a first direction, and the second direction intersects the first direction.

13. The display panel according to claim 11, wherein the second shift registers comprises a first shift sub-register and a second shift sub-register, and wherein the at least one first pixel circuit comprises at least three first pixel circuits, and in the second direction, wherein there are n1 first pixel circuits of the at least three first pixel circuits provided between the first shift sub-register and the arc-shaped edge, and there are n2 first pixel circuits of the at least three first pixel circuits provided between the second shift sub-register and the arc-shaped edge, where n1≠n2.

14. A display device comprising the display panel according to claim 1.

15. A display panel, having a display region and comprising:

a substrate;
light-emitting elements located in the display region;
pixel circuits; and
at least one driving circuit,
wherein the light-emitting elements, the pixel circuits, and the at least one driving circuit are located at a side of the substrate;
wherein the light-emitting elements are connected to the pixel circuits, and each of the at least one driving circuit comprises shift registers;
wherein the pixel circuits comprise at least one first pixel circuit, the at least one driving circuit comprises a first driving circuit, and the at least one first pixel circuit and at least one shift register of the shift registers of the first driving circuit are located in the display region;
wherein, in the display region, the at least one first pixel circuit is arranged at sides of the shift registers of the first driving circuit that are close to an edge of the display panel; and
wherein the display panel further has a non-display region at least partially surrounding the display region, wherein the at least one driving circuit further comprises a second driving circuit located in the non-display region, and the second driving circuit is located between the at least one first pixel circuit and the edge of the display panel.

16. The display panel according to claim 15, wherein the shift registers of the first driving circuit located in the display region are arranged along a first direction, and the shift registers of the second driving circuit are arranged along the first direction; and wherein the first driving circuit in the display region has a first width in a second direction, and the second driving circuit has a second width in the second direction, wherein the first width is smaller than the second width, and the second direction intersects the first direction.

17. The display panel according to claim 15, wherein the first driving circuit comprises a light-emitting driving circuit, and the second driving circuit comprises a scanning driving circuit.

18. The display panel according to claim 15, wherein each of the light-emitting elements comprises a first electrode, a light-emitting layer, and a second electrode, wherein the second electrodes of the light-emitting elements are connected to each other to form a common electrode;

wherein the display panel has an electrode contact region in which the common electrode is connected to a power supply bus; and wherein, in a direction perpendicular to a plane of the substrate, the electrode contact region at least partially overlaps with the second driving circuit.

19. The display panel according to claim 18, further comprising:

an encapsulation barrier located at a side of the electrode contact region close to the edge of the display panel, wherein, in the direction perpendicular to the plane of the substrate, the encapsulation barrier at least partially overlaps with the second driving circuit.

20. A display panel, having a display region and comprising:

a substrate;
light-emitting elements located in the display region;
pixel circuits; and
at least one driving circuit,
wherein the light-emitting elements, the pixel circuits, and the at least one driving circuit are located at a side of the substrate;
wherein the light-emitting elements are connected to the pixel circuits, and each of the at least one driving circuit comprises shift registers;
wherein the pixel circuits comprise at least one first pixel circuit, the at least one driving circuit comprises a first driving circuit, and the at least one first pixel circuit and at least one shift register of the shift registers of the first driving circuit are located in the display region;
wherein, in the display region, the at least one first pixel circuit is arranged at sides of the shift registers of the first driving circuit that are close to an edge of the display panel;
wherein the first driving circuit comprises a first driving sub-circuit and a second-driving sub-circuit;
wherein, in the display region, none of the pixel circuits is provided between the first-driving sub-circuit and the second driving sub-circuit; and
wherein one of the first driving sub-circuit and the second driving sub-circuit is a scan driving circuit, and the other one of the first driving sub-circuit and the second driving sub-circuit is a light-emitting driving circuit.

* * * * *